United States Patent
Wei et al.

(10) Patent No.: US 8,021,942 B2
(45) Date of Patent: Sep. 20, 2011

(54) METHOD OF FORMING CMOS DEVICE HAVING GATE INSULATION LAYERS OF DIFFERENT TYPE AND THICKNESS

(75) Inventors: Andy Wei, Dresden (DE); Andrew Waite, Dresden (DE); Martin Trentzsch, Dresden (DE); Johannes Groschopf, Roederland (DE); Gunter Grasshoff, Radebeul (DE); Andreas Ott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 29 days.

(21) Appl. No.: 12/049,548

(22) Filed: Mar. 17, 2008

(65) Prior Publication Data

US 2009/0057769 A1    Mar. 5, 2009

(30) Foreign Application Priority Data

Aug. 31, 2007   (DE) .......................... 10 2007 041 207

(51) Int. Cl.
*H01L 21/8238*    (2006.01)
*H01L 21/70*      (2006.01)
*H01L 27/092*     (2006.01)

(52) U.S. Cl. ................ 438/216; 257/369; 257/E21.635; 257/E21.636; 257/E21.637; 257/E21.639; 257/E27.06; 438/199; 438/275; 438/278; 438/585; 438/591; 438/926

(58) Field of Classification Search .................... 438/216
See application file for complete search history.

(56) References Cited

U.S. PATENT DOCUMENTS

| | | | |
|---|---|---|---|
| 5,335,256 A | 8/1994 | Maruyama et al. | 378/35 |
| 6,159,782 A * | 12/2000 | Xiang et al. | 438/197 |
| 6,207,516 B1 | 3/2001 | Tang | 438/301 |
| 6,251,729 B1 * | 6/2001 | Montree et al. | 438/257 |
| 6,514,827 B2 * | 2/2003 | Kim et al. | 438/292 |
| 6,709,920 B2 | 3/2004 | Boo et al. | 438/257 |
| 6,849,511 B2 * | 2/2005 | Iriyama et al. | 438/275 |
| 6,864,163 B1 | 3/2005 | Yu et al. | 438/585 |
| 6,872,627 B2 * | 3/2005 | Chen et al. | 438/303 |
| 7,176,090 B2 * | 2/2007 | Brask et al. | 438/270 |
| 7,211,876 B2 | 5/2007 | Tani | 257/532 |

(Continued)

FOREIGN PATENT DOCUMENTS

DE    10 2005 052 054 A1    5/2007

(Continued)

OTHER PUBLICATIONS

Translation of Official Communication from German Patent Office for German Patent Application No. 10 2007 041 207.1-33 dated May 21, 2008.

(Continued)

*Primary Examiner* — Ha Tran T Nguyen
*Assistant Examiner* — Raj R Gupta
(74) *Attorney, Agent, or Firm* — Williams, Morgan & Amerson, P.C.

(57) ABSTRACT

In the process sequence for replacing conventional gate electrode structures by high-k metal gate structures, the number of additional masking steps may be maintained at a low level, for instance by using highly selective etch steps, thereby maintaining a high degree of compatibility with conventional CMOS techniques. Furthermore, the techniques disclosed herein enable compatibility to front-end process techniques and back-end process techniques, thereby allowing the integration of well-established strain-inducing mechanisms in the transistor level as well as in the contact level.

22 Claims, 15 Drawing Sheets

U.S. PATENT DOCUMENTS

| | | | |
|---|---|---|---|
| 2002/0045332 A1* | 4/2002 | Jang et al. | 438/585 |
| 2002/0058374 A1* | 5/2002 | Kim et al. | 438/228 |
| 2002/0086445 A1* | 7/2002 | Kim et al. | 438/1 |
| 2004/0104405 A1* | 6/2004 | Huang et al. | 257/199 |
| 2004/0198009 A1* | 10/2004 | Chen et al. | 438/303 |
| 2005/0055494 A1* | 3/2005 | Doris et al. | 711/103 |
| 2005/0237850 A1* | 10/2005 | Datta et al. | 365/232 |
| 2006/0022277 A1* | 2/2006 | Kavalieros et al. | 257/369 |
| 2006/0051957 A1* | 3/2006 | Brask et al. | 438/637 |
| 2006/0286729 A1 | 12/2006 | Kavalieros et al. | 438/183 |
| 2006/0289920 A1* | 12/2006 | Wu et al. | 257/310 |
| 2007/0264827 A1* | 11/2007 | Ding et al. | 438/692 |

FOREIGN PATENT DOCUMENTS

GB        2 347 789 A   *   9/2000

OTHER PUBLICATIONS

PCT Search Report and Written Opinion from PCT/US2008/010299 dated Mar. 20, 2009.*

Widmann et al., "Technologie hochintergrierter Schaultungen," $2^{nd}$ edition, Berlin, Springer, pp. 314-315, 1996.

Translation of Official Communication from German Patent Application No. 10 2007 041 207.1 dated Jul. 6, 2011.

* cited by examiner

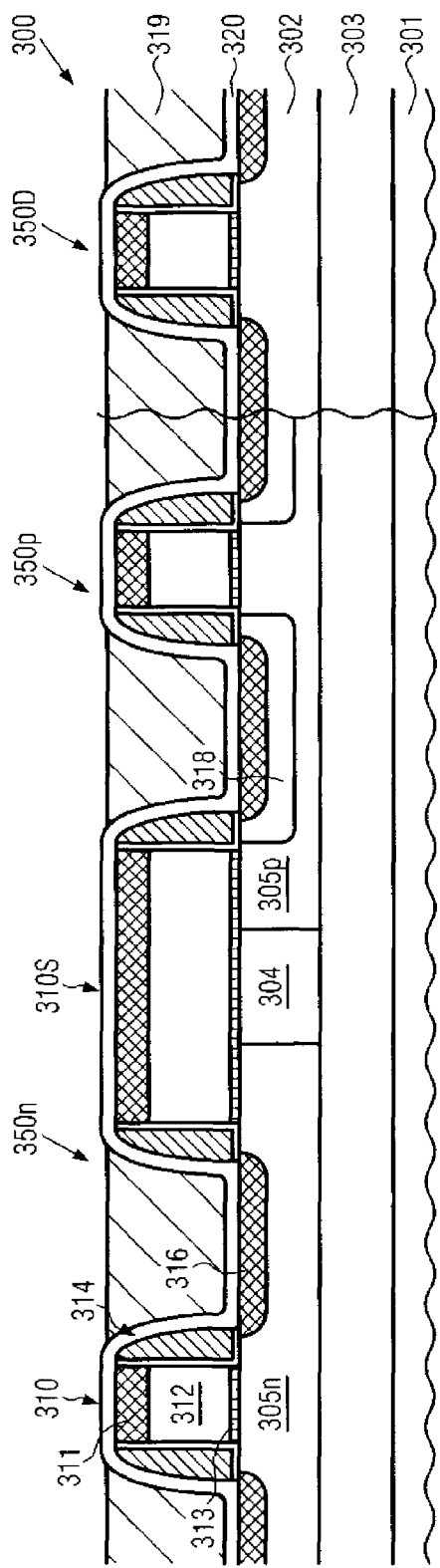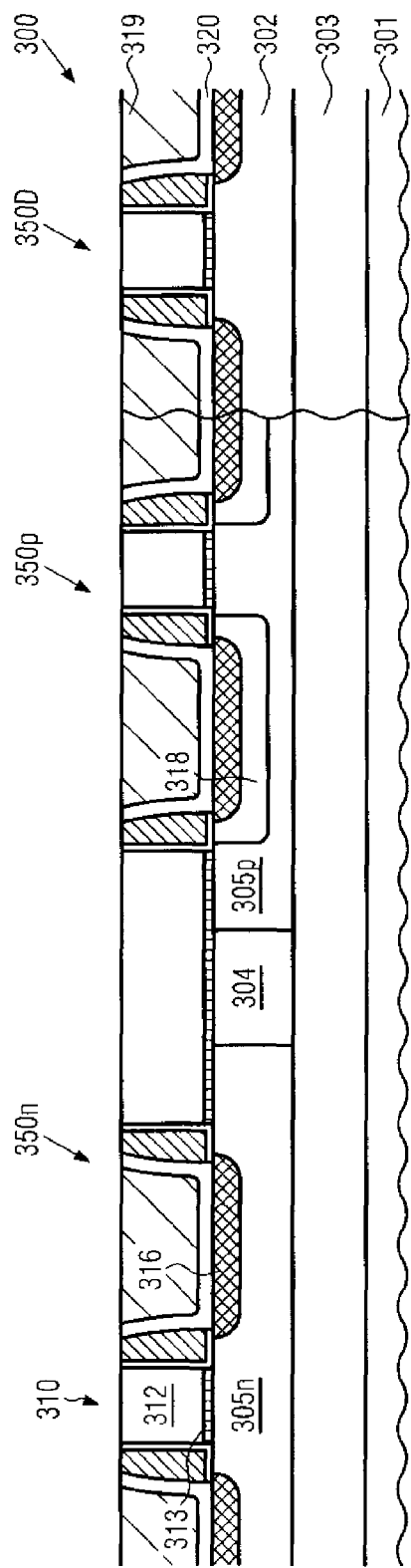

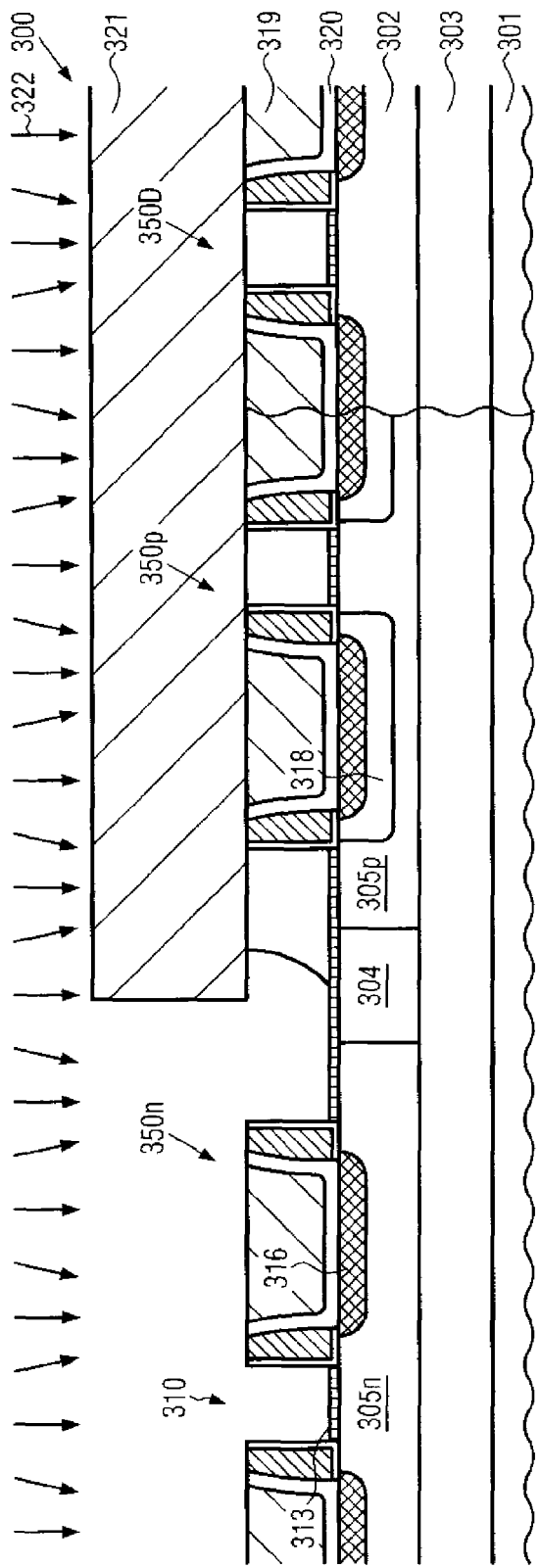
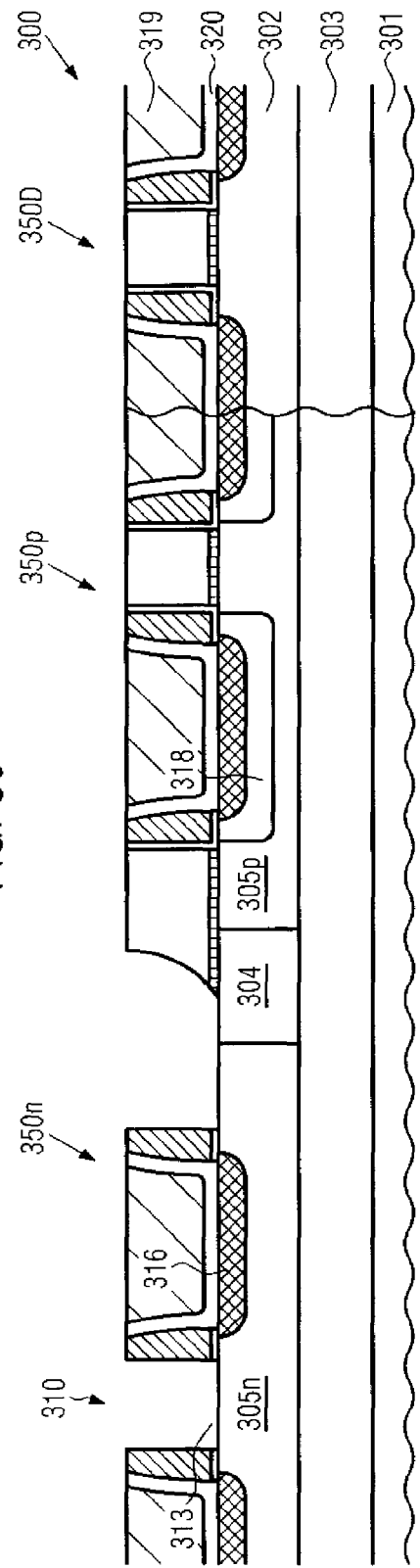
FIG. 3e
FIG. 3f

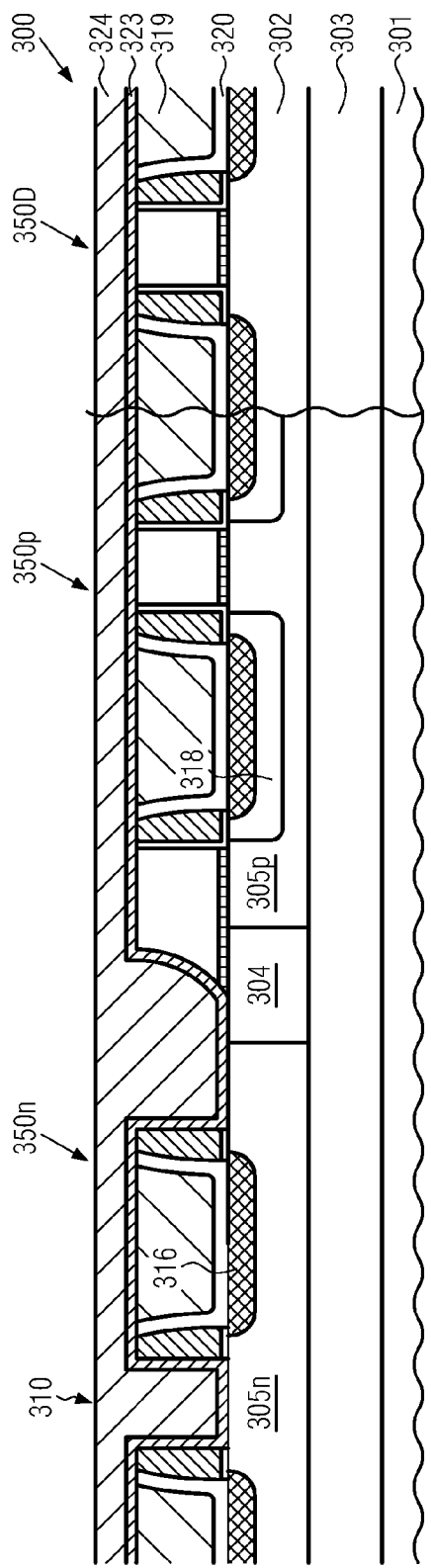
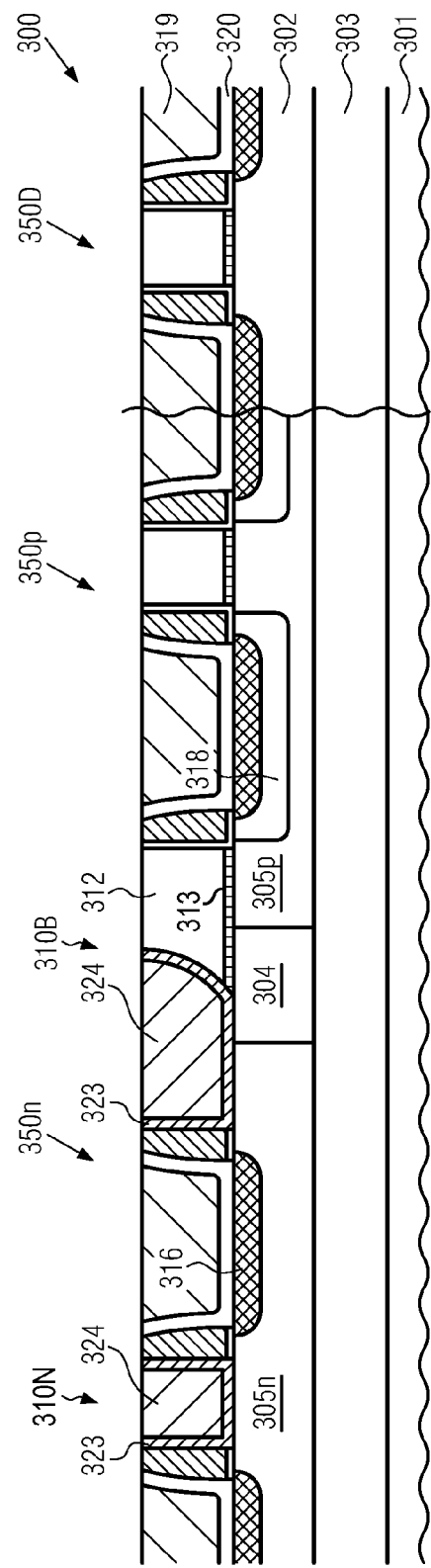
FIG. 3g
FIG. 3h

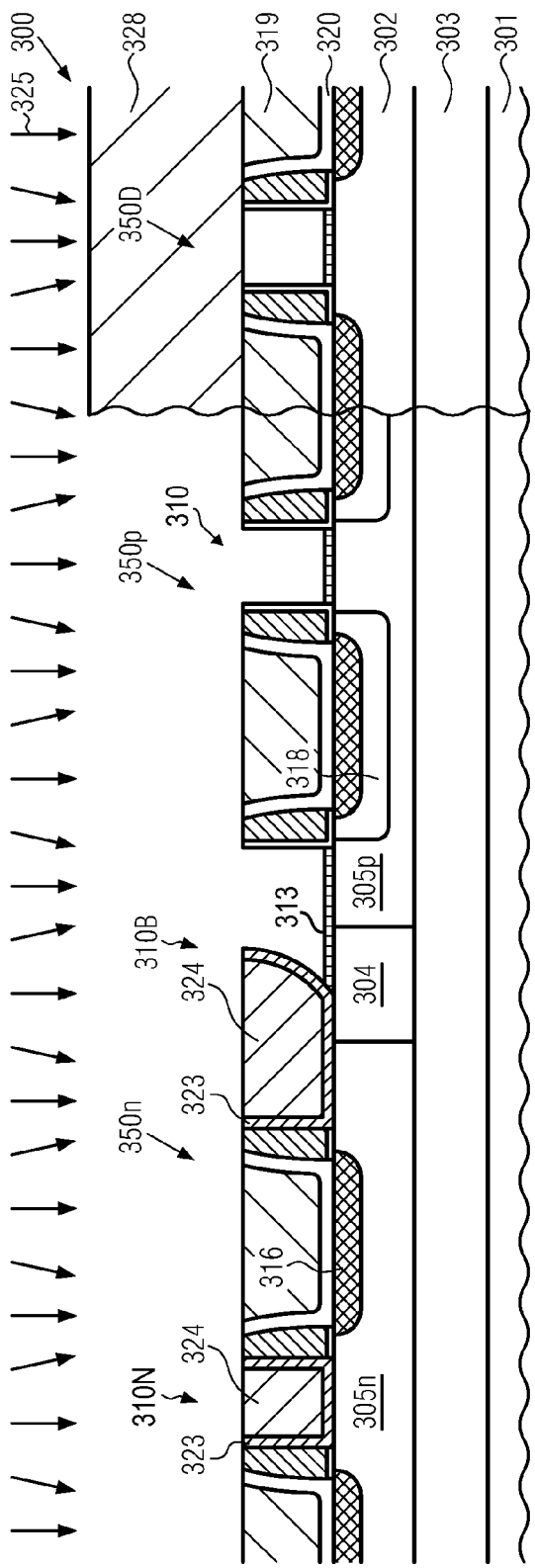
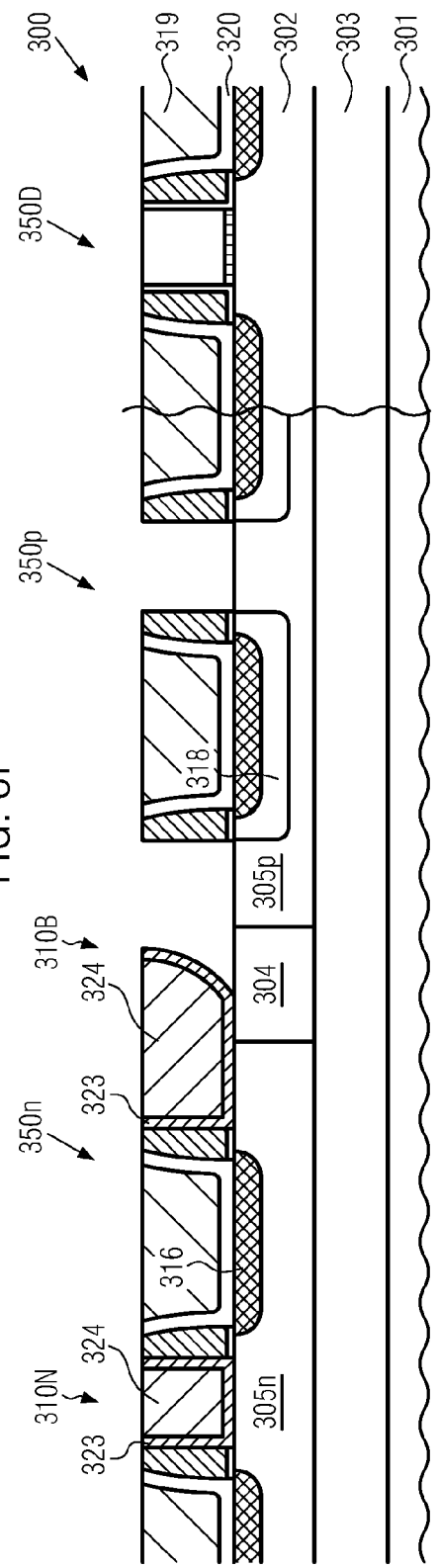

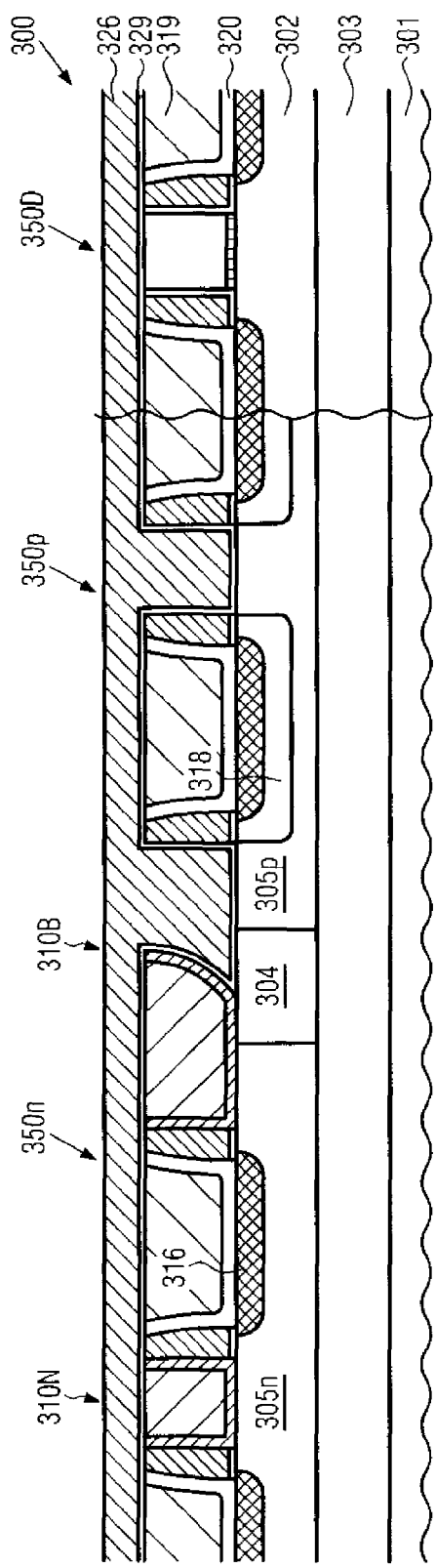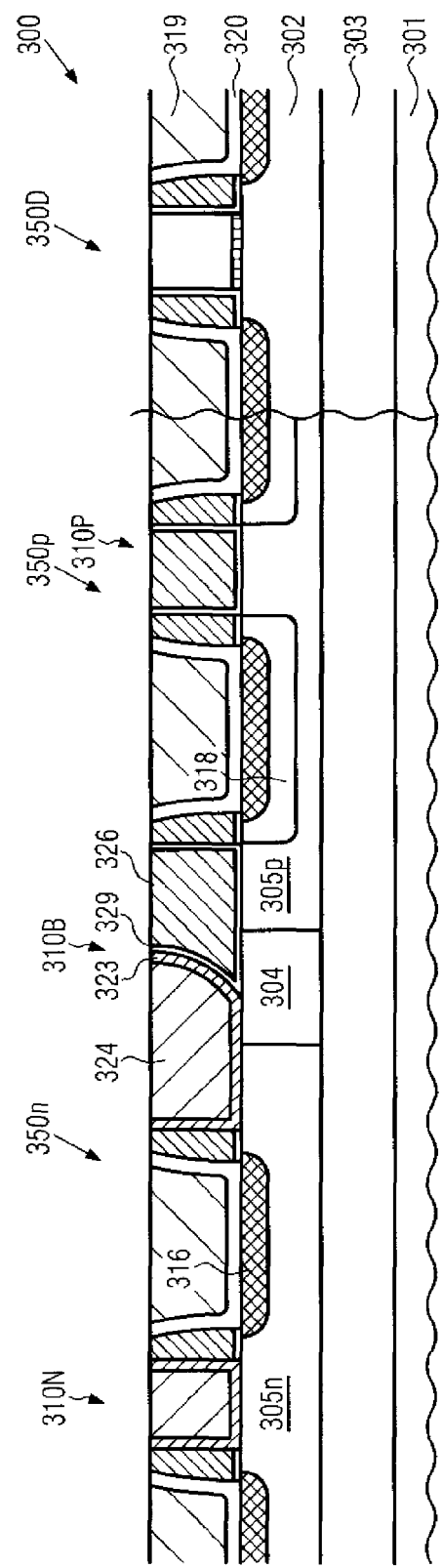
FIG. 3k
FIG. 3l

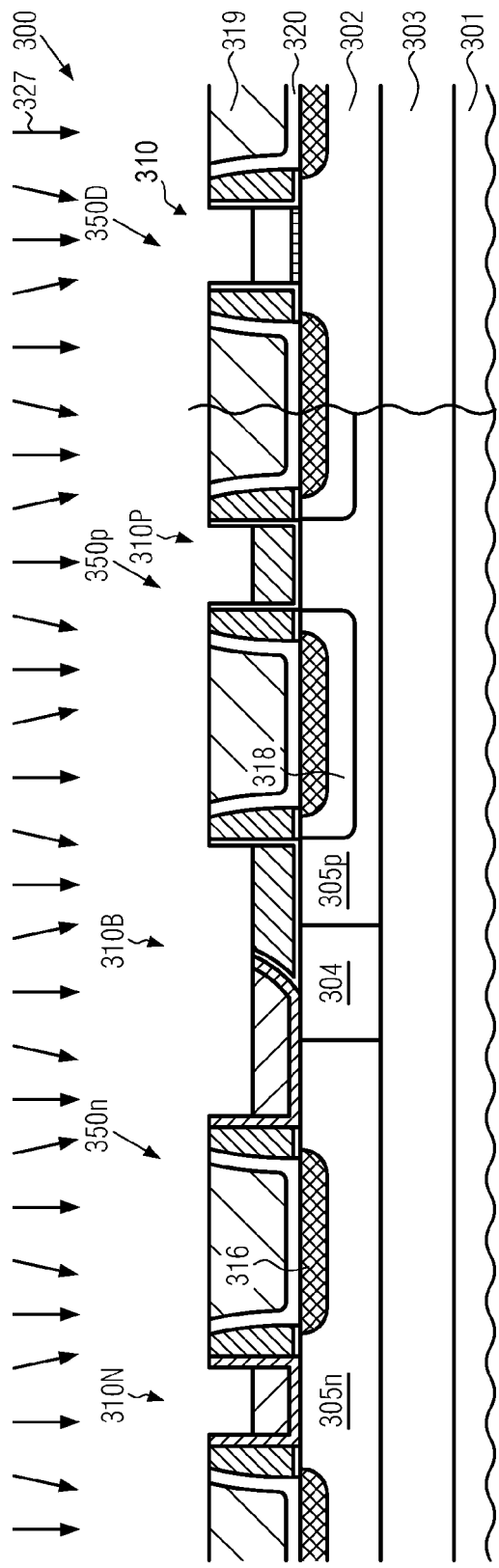
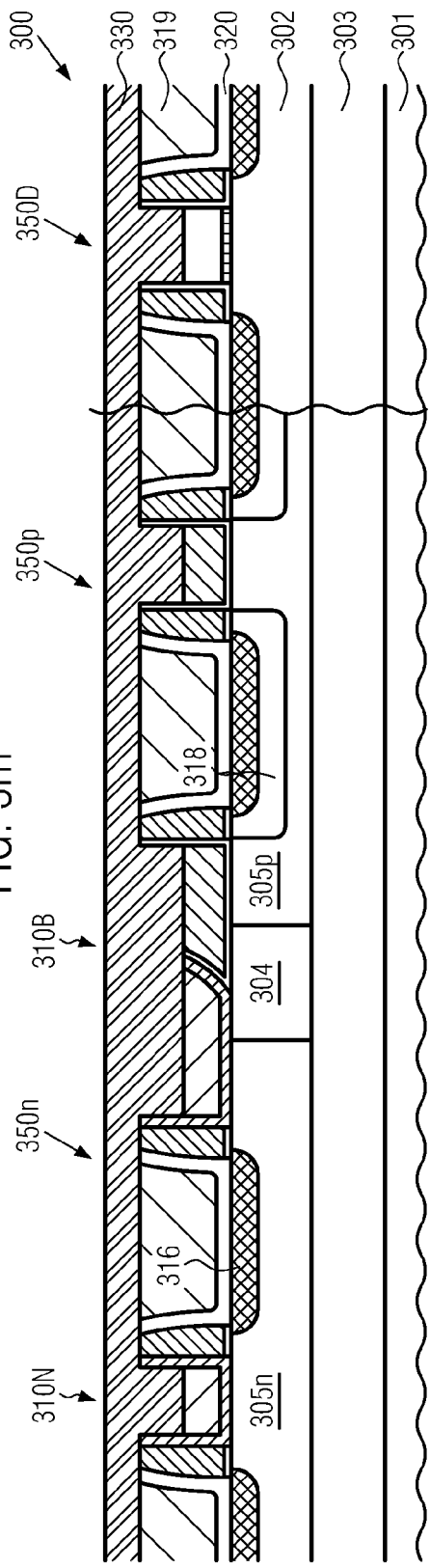
FIG. 3m
FIG. 3n

METHOD OF FORMING CMOS DEVICE HAVING GATE INSULATION LAYERS OF DIFFERENT TYPE AND THICKNESS

BACKGROUND OF THE INVENTION

1. Field of the Invention

Generally, the present disclosure relates to the fabrication of highly sophisticated integrated circuits including highly scaled transistor elements comprising highly capacitive gate structures including a high-k gate dielectric of increased permittivity compared to gate dielectrics, such as silicon dioxide and silicon nitride.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit elements that substantially determine performance of the integrated circuits. Generally, a plurality of process technologies are currently practiced, wherein, for many types of complex circuitry, including field effect transistors, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer. A field effect transistor, irrespective of whether an N-channel transistor is considered, typically comprises so-called PN junctions that are formed by an interface of highly doped regions, referred to as drain and source regions, with a slightly doped or non-doped region, such as a channel region, disposed adjacent to the highly doped regions.

In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity and increase of gate resistivity, is a dominant design criterion for accomplishing an increase in the operating speed of the integrated circuits.

Presently, the vast majority of integrated circuits are based on silicon due to substantially unlimited availability, the well-understood characteristics of silicon and related materials and processes and the experience gathered during the last 50 years. Therefore, silicon will likely remain the material of choice for future circuit generations designed for mass products. One reason for the dominant importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows the performance of subsequent high temperature processes, as are required, for example, for anneal cycles to activate dopants and to cure crystal damage without sacrificing the electrical characteristics of the interface.

For the reasons pointed out above, silicon dioxide is preferably used as a gate insulation layer in field effect transistors that separates the gate electrode, frequently comprised of polysilicon or other metal-containing materials, from the silicon channel region. In steadily improving device performance of field effect transistors, the length of the channel region has continuously been decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although generally high speed transistor elements having an extremely short channel may preferably be used for high speed applications, whereas transistor elements with a longer channel may be used for less critical applications, such as storage transistor elements, the relatively high leakage current caused by direct tunneling of charge carriers through an ultra-thin silicon dioxide gate insulation layer may reach values for an oxide thickness in the range or 1-2 nm that may not be compatible with requirements for performance driven circuits.

Therefore, replacing silicon dioxide as the material for gate insulation layers has been considered, particularly for extremely thin silicon dioxide gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. Commonly, a thickness required for achieving a specified capacitive coupling with silicon dioxide is referred to as capacitance equivalent thickness (CET). Thus, at a first glance, it appears that simply replacing the silicon dioxide with high-k materials is a straightforward way to obtain a capacitance equivalent thickness in the range of 1 nm and less.

It has thus been suggested to replace silicon dioxide with high permittivity materials, such as tantalum oxide ($Ta_2O_5$) with a k of approximately 25, strontium titanium oxide (Sr-$TiO_3$) having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide layer, while additionally maintaining leakage currents at an acceptable level. On the other hand, the non-polysilicon material, such as titanium nitride and the like, may be formed to connect to the high-k dielectric material, thereby substantially avoiding the presence of a depletion zone. Since typically a low threshold voltage of the transistor, which represents the voltage at which a conductive channel forms in the channel region, is desired to obtain the high drive currents, commonly the controllability of the respective channel requires pronounced lateral dopant profiles and dopant gradients, at least in the vicinity of the PN junctions. Therefore, so-called halo regions are usually formed by ion implantation in order to introduce a dopant species whose conductivity type corresponds to the conductivity type of the remaining channel and semiconductor region so as to "reinforce" the resulting PN junction dopant gradient after the formation of respective extension and deep drain and source regions. In this way, the threshold voltage of the transistor significantly determines the controllability of the channel, wherein a significant variance of the threshold voltage may be observed for reduced gate lengths. Hence, by providing an appropriate halo implantation region, the controllability of the channel may be enhanced, thereby also reducing the variance of the threshold voltage, which is also referred to as threshold roll-off, and also reducing significant variations of transistor performance with a variation in gate length. Since the threshold voltage of the transistors is significantly determined by the work function of the metal-containing gate material, an appropriate adjustment of the effective work function with respect to the conductivity type of the transistor under consideration has to be guaranteed.

After forming sophisticated gate structures including a high-k dielectric and a metal-based gate material, however, high temperature treatments may be required, which may result in a reduction of the permittivity of the gate dielectric caused by an increase of the oxygen contents in the high-k material, thereby also resulting in an increase of layer thickness. Furthermore, a shift of the work function may be observed which is believed to be associated with the enhanced oxygen affinity of many high-k dielectric materials, resulting in a re-distributing of oxygen from trench isolation structure via the high-k dielectric material of shared gate line structures, in particular at the moderately high temperatures required for completing the transistors after forming the high-k metal gate structure. Due to this Fermi level shift in the metal-containing gate materials, the resulting threshold voltage may become too high to enable the use of halo implantation techniques for adjusting the transistor characteristics with respect to controlling threshold voltage roll-off to allow high drive current values at moderately low threshold voltages.

The moderate and high temperatures during the transistor fabrication process may be avoided by using an integration scheme, in which the gate electrode structure is formed according to conventional techniques and is finally replaced by a sophisticated high-k metal gate structure, wherein the respective metals are appropriately selected so as to have suitable work functions for N-channel transistors and P-channel transistors, respectively. Thus, in this integration scheme, the conventional polysilicon/oxide gate structure is removed and replaced by the high-k metal stack after the final high temperature anneal processes and the silicidation of the drain and source regions. Hence, the high-k metal gate electrode structure may only experience low temperatures used in the back-end processing, that is, temperatures of approximately 400° C., thereby substantially avoiding the above-described problems with respect to altering the characteristics of the high-k material and shifting the work functions of the metals in the gate electrodes.

As previously explained, the N-channel transistors and P-channel transistors require very different metal-containing materials for appropriately adjusting the work function and thus the threshold voltage of the different transistor types. Therefore, respective integration schemes may be highly complex and may also be difficult to be combined with well-established dual overlayer stressor approaches, which are typically used for providing a highly stressed dielectric material with different intrinsic stress above the N-channel transistors and the P-channel transistors, respectively. In addition, in many cases, transistors in different device regions, such as CPU cores, peripheral regions for input/output, memory regions and the like, may be operated at different supply voltages, thereby requiring an appropriately adjusted layer thickness of the gate insulation layers, which in conventional integration strategies is accomplished by growing an increased oxide thickness as required for the highest operating voltage and selectively reducing the oxide thickness to a desired low level at high performance regions operated at low supply voltages. The integration of gate dielectrics adapted to different operating voltages may be difficult to be combined with an approach for forming the high-k metal gates after completing the transistor structures, since a plurality of complex masking regimes may be required.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to sophisticated semiconductor devices and methods for forming the same, in which gate electrode structures may be formed on the basis of a high-k dielectric in combination with appropriate metal-containing conductive materials having appropriate work functions for P-channel transistors and N-channel transistors, respectively, wherein the gate electrode structures may be formed after any high temperature treatments required during the formation of the complete transistor structures, thereby essentially avoiding any shifts in work functions and deleterious effects on the high-k dielectric materials, as previously described. For this purpose, in one illustrative aspect disclosed herein, the transistors may be formed on the basis of well-established CMOS techniques, after which the replacement of one type of conventionally formed gate electrode structures may be accomplished on the basis of a highly selective etch process, thereby avoiding the necessity for a respective masking step involving sophisticated lithography processes. Consequently, the further processing after completion of the transistor structures may be performed with a high degree of compatibility with conventional strategies without adding undue process complexity. In still other illustrative aspects disclosed herein, an enhanced integration scheme is described in which the transistor structures may be formed on the basis of well-established techniques, wherein gate electrode structures may be formed on the basis of conventional dielectric materials, such as silicon dioxide, designed in accordance with the requirements for a specific type of transistors, for instance, transistors to be operated at higher voltages, thereby requiring an increased gate oxide thickness. Thereafter, the device regions having formed therein dummy gate electrode structures and the device regions containing the specified gate electrode structures having the appropriate gate dielectric thickness may be prepared for receiving the replacement gate electrode structures in the former device areas, while a significant portion of the gate electrode structures in the latter device areas may be maintained, that is, at least the gate dielectric material and a portion of the conventional gate electrode material may be maintained throughout the process sequence for replacing the conventional gate electrode structures by an electrode structure including a high-k dielectric material in combination with a metal-containing material having the suitable work function. Subsequently, an additional highly conductive material may be formed in both types of gate electrode structures, thereby forming a highly conductive path in the conventional gate electrode structures, which may act as a replacement for the metal silicide regions that may have been removed prior to providing the sophisticated gate electrode structures. Consequently, also in this case, a high degree of compatibility with conventional strategies may be achieved, wherein an appropriate masking regime may enable substantially maintaining a conventional gate electrode structure designed for a specific type of transistor throughout the process for replacing dummy gate structures by sophisticated high-k metal gate materials.

Furthermore, in some illustrative aspects disclosed herein, the above-described strategies may be combined to form sophisticated transistor elements requiring thin gate dielectrics on the basis of an increased permittivity in combination with specifically designed metal-containing gate materials having appropriate work functions for P-channel transistors and N-channel transistors, while substantially maintaining conventional gate electrode structures, which may be operated on the basis of an increased gate dielectric thickness so that the transistor elements may be formed with a high degree of compatibility with conventional CMOS techniques, thereby enabling the employment of any desired performance-enhancing strategies, such as semiconductor alloys or materials creating a desired type of strain in the respective channel regions during the formation of the basic transistor structures, while additionally a high degree of compatibility with further strategies may be obtained for enhancing the transistor performance on the basis of stressed overlayers to be formed after the completion of the sophisticated replacement gate electrode structures.

One illustrative method disclosed herein comprises forming a first transistor having a first gate electrode structure above a first device region. The method further comprises forming a second transistor having a second gate electrode structure above a second device region. Furthermore, the first gate electrode structure is replaced by a first replacement gate electrode structure comprising a high-k dielectric material and a first metal-containing gate electrode material while covering the second transistor by a mask. The method further comprises removing the second gate electrode structure on the basis of a selective etch process while the first replacement gate electrode structure remains substantially non-covered. Finally, the method comprises forming a second replacement gate electrode structure comprising a high-k material and a second metal-containing gate electrode material.

A further illustrative method disclosed herein comprises forming a first gate electrode structure in a first device region and a second gate electrode structure in a second device region in a common process sequence, wherein the first and second gate electrode structures comprise a gate insulation dielectric and a gate electrode material and wherein the gate insulation dielectric has a first thickness corresponding to a design thickness of the second gate electrode structure. The method further comprises forming a first transistor on the basis of the first gate electrode structure and a second transistor on the basis of the second gate electrode structure. Finally, the method comprises, after forming the first and second transistors, replacing the first gate electrode structure by a first replacement gate electrode structure comprising a first high-k dielectric material and a first conductive metal-containing material while maintaining the gate insulation dielectric and a portion of the gate electrode material of the second gate electrode structure.

An illustrative semiconductor device disclosed herein comprises a first transistor comprising a first gate electrode structure including a first high-k dielectric material and a first metal-containing gate electrode material. The device further comprises a second transistor comprising a second gate electrode structure including an oxide-based gate dielectric material connected to a semiconductor-based gate electrode material. Finally, the semiconductor device comprises a third transistor comprising a third gate electrode structure including a second high-k dielectric material and a second metal-containing gate electrode material, wherein the first, second and third gate electrode structures further comprise a third metal-containing material.

BRIEF DESCRIPTION OF THE DRAWINGS

The disclosure may be understood by reference to the following description taken in conjunction with the accompanying drawings, in which like reference numerals identify like elements, and in which.

Figure 1A:
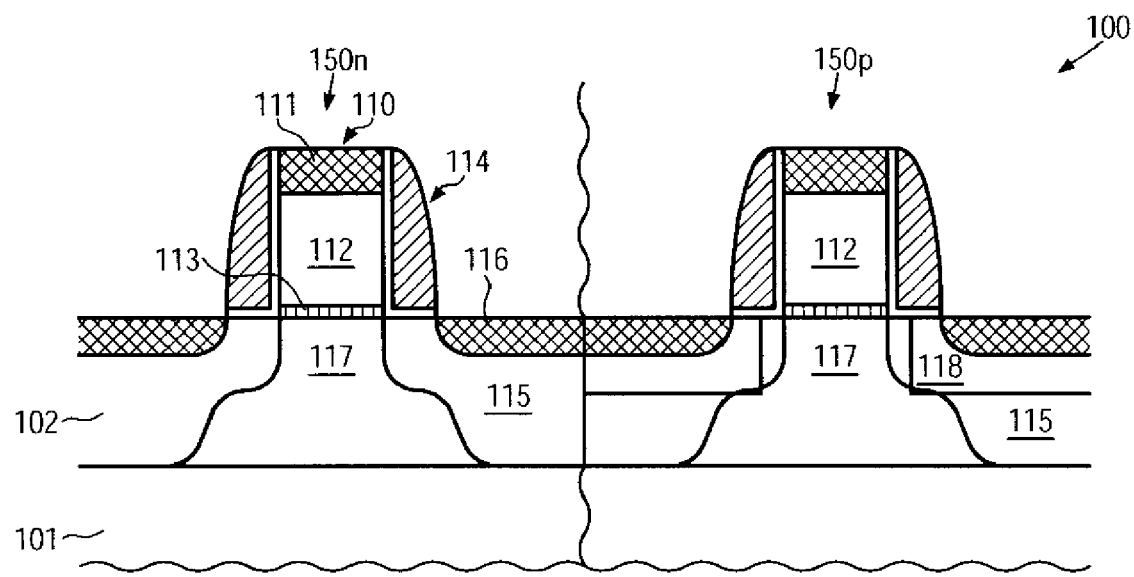
FIGS. 1a-1h schematically illustrate cross-sectional views of a transistor device including P-channel transistors and N-channel transistors receiving a sophisticated replacement gate electrode structure on the basis of a high-k dielectric material and an appropriately selected metal after completing the transistor structures, wherein a sophisticated selective etch technique may be used for replacing at least one type of gate electrode structure, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the subject matter disclosed herein provides enhanced techniques and devices manufactured by these techniques, wherein sophisticated high-k dielectric metal gate stacks may be formed after the completion of the transistor structures with a reduced number of lithography steps and hard masks in order to maintain a high degree of compatibility with well-established CMOS integration schemes, thereby also enabling the integration of well-established strain-inducing mechanisms, such as the provision of strained semiconductor alloys in drain and source regions of the transistors, highly stressed dielectric materials for embedding the transistor structures and the like. For this purpose, the process sequence for replacing at least one type of gate electrode structure may be performed on the basis of a highly selective etch process without requiring the coverage of device regions in which a metal gate has already been provided and/or substantially maintaining a conventional gate electrode structure in device areas in which this type of gate electrode structure is appropriate for the performance of the corresponding transistor elements, such as transistors operating at a moderately high supply voltage and the like.

FIG. 1a schematically illustrates a cross-sectional view of a semiconductor device 100 in a manufacturing stage in which basic transistor structures have been completed, i.e., any high temperature processes have been performed to allow the formation of sophisticated gate electrode structures on the basis of a high-k dielectric material and appropriately selected metal-containing materials as previously described. Thus, the semiconductor device 100 may comprise a substrate 101, which may represent any appropriate carrier material for forming thereabove a semiconductor layer 102, such as a silicon-based layer or any other appropriate semiconductor material for forming therein and thereon transistor elements 150n, 150p, which may represent, in the embodiment shown, an N-channel transistor and a P-channel transistor, respectively. It should be appreciated that the semiconductor layer 102, even if it may be provided as a silicon-based layer, may include other materials, such as germanium, carbon and the like, in addition to any appropriate dopant species for establishing the required lateral and vertical dopant profiles in the transistors 150n, 150p. For example, in the embodiment shown, the transistor 150p may comprise a semiconductor alloy 118, which may be provided in the form of any appropriate semiconductor compound to induce a desired type of strain in a channel region 117, which may be comprised of silicon, as silicon may exhibit a significant variation of charge carrier mobility when provided in a strained state. For instance, the semiconductor alloy 118, which may be a silicon/germanium alloy for a P-channel transistor, may be provided at least in a portion of the respective drain and source regions 115, wherein the semiconductor alloy 118 may have a reduced lattice constant due to its strained state compared to its natural lattice constant that is greater than the lattice constant of silicon, may thus induce a certain magnitude of compressive strain in the channel region 117, thereby enhancing the mobility of holes. It should be appreciated that other strain-inducing mechanisms may be provided in the transistors 150n, 150p, depending on the overall process strategy. That is, for silicon-based transistor devices, a silicon/carbon compound may be formed in the drain and source regions of the transistor 150n when representing an N-channel transistor and the like. Also, stress memorization techniques may be employed during the formation of the transistors, thereby endowing at least one type of transistor with a certain basic strain.

Furthermore, the transistors 150n, 150p may be formed as bulk transistors, i.e., the semiconductor layer 102 may be formed on a substantially crystalline substrate material, while in other cases specific device regions of the device 100 or the entire device 100 may be formed on the basis of a silicon-on-insulator (SOI) architecture, in which a buried insulating layer (not shown) may be provided below the semiconductor layer 102.

Moreover, each of the transistor elements 150n, 150p may comprise a gate electrode structure 110 including, for instance, a conventional gate dielectric material 113, such as a silicon dioxide based gate dielectric, above which may be formed a conventional gate electrode material 112, such as a polysilicon material and the like, followed by a metal silicide region 111. Similarly, metal silicide regions 116 may be formed in the drain and source regions of the transistors 150n, 150p. Furthermore, depending on the process strategy, a sidewall spacer structure 114 may be provided on the sidewalls of the gate electrode structures 110.

The semiconductor device 100 as shown in FIG. 1a may be formed on the basis of well-established process techniques.

For instance, the gate electrode structures 110 may be formed on the basis of sophisticated deposition and/or oxidation techniques for forming the gate dielectric materials 113, wherein an appropriate thickness may be selected, as will be described later on with reference to FIGS. 2a-2c and 3a-3q. Thereafter, sophisticated lithography and etch techniques may be used for forming the gate electrode material 112, for instance, in the form of polysilicon and the like. Next, the sidewall spacer structure 114 may be formed, at least partially, so as to act as an appropriate implantation mask for creating the lateral dopant profile for the drain and source regions 115. It should be appreciated that a plurality of implantation processes may be required, such as pre-amorphization implantation, halo implantation, extension implantation and deep drain and source implantations for obtaining the required complex dopant profile. As previously explained, the efficiency of a respective halo implantation depends on an appropriate work function of a gate electrode metal still to be formed when replacing the gate electrode structure 110 by a sophisticated high-k dielectric metal gate structure. Furthermore, during the formation of the transistor structures 150n, 150p as shown, one or more high temperature treatments may be required, for instance, for activating dopants and re-crystallizing implantation-induced damage and the like. Finally, the metal silicide regions 116 and 111 may be formed in a common process with process parameters adapted to obtain the desired configuration of the metal silicide in the regions 116, while not requiring an adaptation of the process parameters for the metal silicide regions 111, since these regions will be removed in a later manufacturing stage. As previously explained, the respective process techniques may also include any process sequences for forming any desired strain-inducing mechanisms, such as providing the semi-conductor alloy 118 in a portion of the drain and source regions 115. This may be accomplished, for instance, by forming a respective recess in an early manufacturing stage and refilling the recess with the desired semiconductor alloy on the basis of a selective epitaxial growth technique in accordance with well-established integration schemes.

Figure 1B:
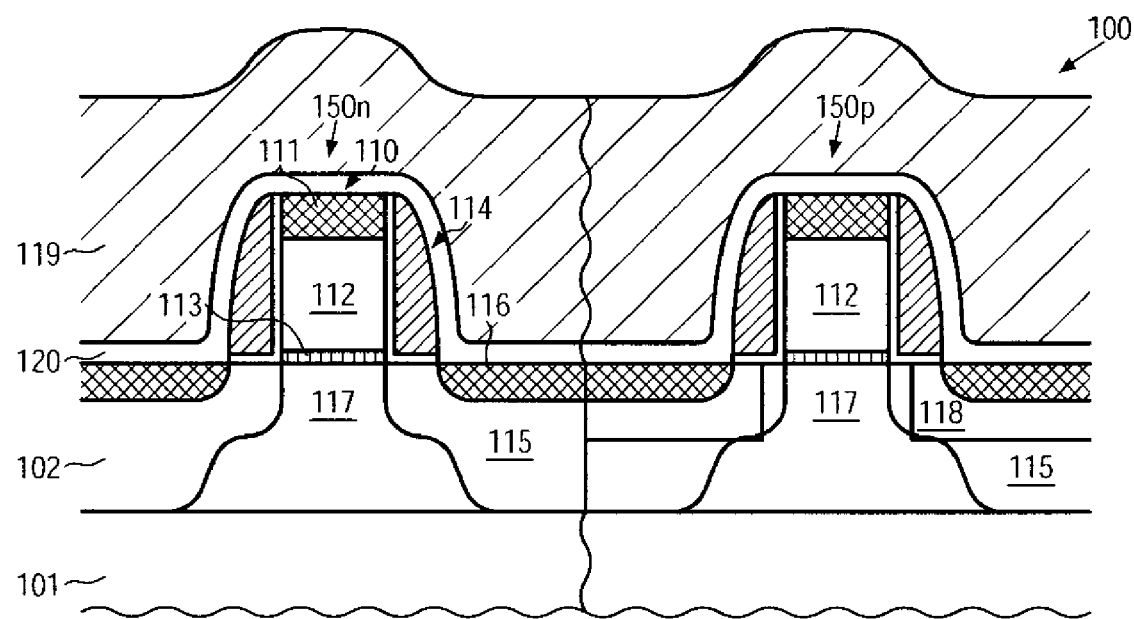

FIG. 1b schematically illustrates the semiconductor device 100 in a further advanced manufacturing stage, in which a sacrificial material 119 is formed to enclose the transistors 150n, 150p, wherein an etch stop layer 120 may be provided to enable a reliable removal of the sacrificial material 119 in a later manufacturing stage. The sacrificial material 119 may be provided in the form of any appropriate material, such as silicon dioxide, that may be deposited on the basis of well-established techniques, such as sub-atmospheric chemical vapor deposition (SACVD), high density plasma enhanced chemical vapor deposition (PECVD) on the basis of TEOS, which may also be used for the formation of an inter-layer dielectric material in well-established CMOS techniques. Similarly, the etch stop layer 120 may be provided in the form of a silicon nitride material, which may be provided in some cases with a desired type of intrinsic stress, such as compressive stress, which may be accomplished by appropriately selecting deposition parameters during a PECVD process, as is well known in the art. Next, the semiconductor device 100 may be subjected to a process for removing material, for instance, on the basis of a chemical mechanical polishing (CMP) process sequence.

Figure 1C:
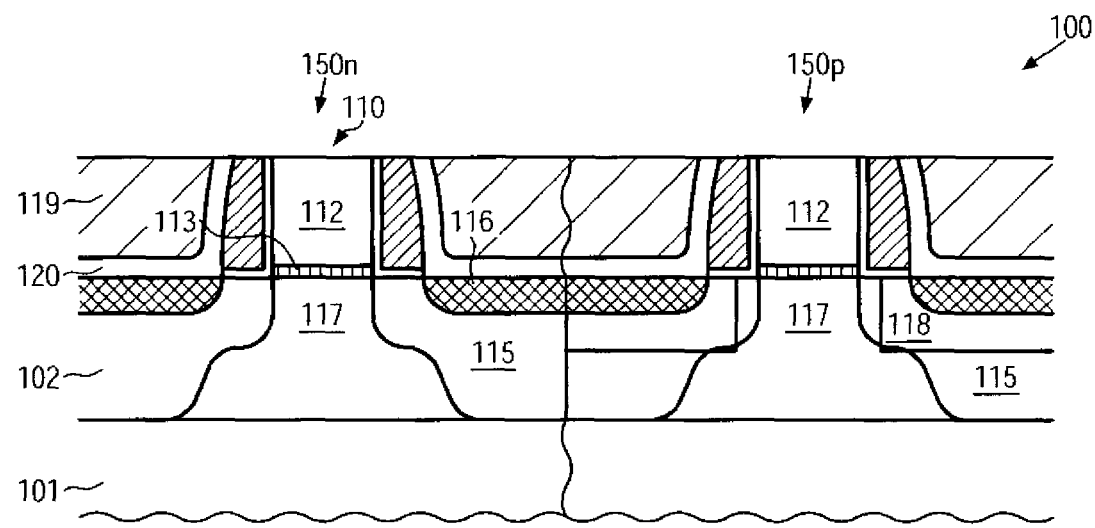

FIG. 1c schematically illustrates the semiconductor device 100 after a corresponding CMP process sequence, which may include a first CMP step, in which excess material of the sacrificial layer 119 may be removed on the basis of a selective CMP recipe, wherein the etch stop layer 120 may also act as a CMP stop layer to provide a high degree of controllability of the material removal process. Thereafter, a further CMP step may be performed with reduced or substantially no selectivity with respect to the material of the etch stop layer 120, the sacrificial layer 119 and the metal silicide regions 111. Consequently, the gate electrode material 112 may be exposed by this additional CMP step. It should be appreciated that the resulting height of the gate electrode structures is less critical, since they may be replaced by a highly conductive material having a superior conductivity compared to the conventional gate electrode material 112, thereby providing increased conductivity, even if the overall height of the gate electrode structure may be reduced compared to the initial height of the gate electrode structures 110.

Figure 1D:
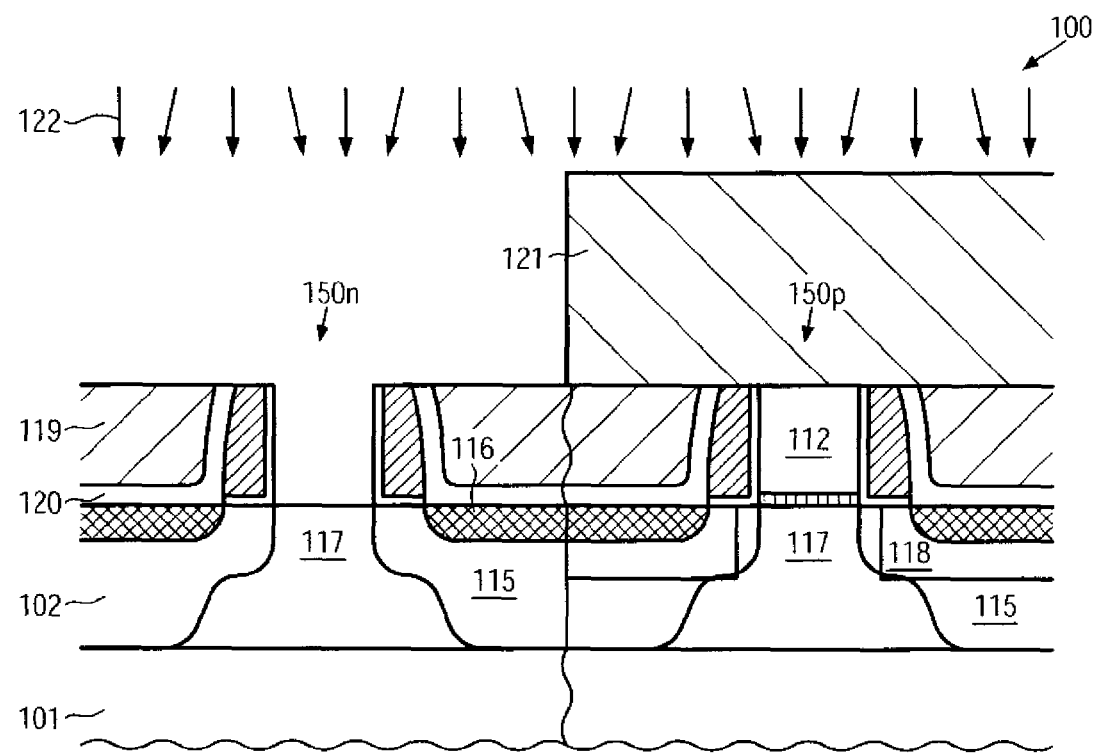

FIG. 1d schematically illustrates the semiconductor device 100 in a further advanced manufacturing stage, in which an etch mask 121 may be provided, for instance, in the form of a resist mask, wherein one type of transistor may be covered while the other type of transistor may be exposed to a selective etch ambient 122 to selectively remove at least the gate electrode material 112. In the embodiment shown, the transistor 150n may be exposed to the etch ambient 122, which may be established on the basis of well-established plasma-based recipes for selectively etching, for instance, polysilicon material with respect to the material of the sacrificial layer 119 and the spacer structure 114. For instance, respective recipes for selectively etching silicon material in the presence of silicon dioxide and silicon nitride may be used for this purpose. Moreover, the etch ambient 122 may be established with a certain degree of isotropy to allow for reliable removal of the gate electrode material 112, even at sidewalls of the spacer structure 114. Moreover, a certain degree of isotropy of the process 122 may also provide a certain degree of under-etching in specific device areas, such as isolation areas, in which the gate electrode structures may be provided as shared "polylines," as will be explained later on with reference to FIGS. 3a-3q.

In other illustrative embodiments, the etch ambient 122 may be established on the basis of appropriate wet chemical recipes, which provide the desired degree of etch selectivity with respect to the materials of the spacer structure 114 and the sacrificial material 119. For example, in one illustrative embodiment, a solution including TMAH (tetramethyl ammonium hydroxide) may be used, wherein TMAH is the basis of a photolithography developer material, which also etches silicon when provided in higher concentrations and at higher temperatures. However, silicon dioxide and silicon nitride are highly resistant to this solution. For example, approximately 20 percent weight of TMAH in water at approximately 80° C. results in a silicon etch rate of approximately 23 µm per hour, wherein the selectivity to oxide is approximately 9200:1 while the selectivity to nitride is approximately 30000:1. Moreover, since TMAH is a developer material, it may not substantially attack resist material, so that the etch mask 121, even if provided as a resist mask, may not be substantially attacked.

It should further be appreciated that in other cases the etch mask 121 may be formed so that the transistor 150p may be exposed while the transistor 150n may be covered so as to remove the gate electrode material 112 of the transistor 150p. A corresponding selection of which transistor may be exposed during the process 122 may be made depending on the etch resistivity of a metal used for replacing the gate electrode material 112. That is, as previously explained, different metal-containing materials have typically been provided for the transistors 150n, 150p, due to the adaptation of the respective work function, so that a subsequent etch process for removing the gate electrode material 112 of the remaining gate electrode structure 110 may be performed on the basis of a metal-containing material having a high etch resistivity. By way of example, in the embodiment shown, it may be assumed that the metal-containing material to be used for the transistor 150n may have a high etch resistivity in a subsequent etch process compared to the metal to be used for the transistor 150p. Next, a clean process may be performed, if required, for removing any byproducts of the process 122 or any residues of the respective etch ambient, which may, for instance, be accomplished on the basis of sulfuric acid in combination with hydrogen peroxide, wherein the resist mask 121 may also be removed. Next, the gate dielectric material 113 may be removed on the basis of an appropriate selective etch process, which may be accomplished by, for instance, using a wet chemical etch recipe including hydrofluoric acid, when the dielectric material 113 is comprised of silicon dioxide. Since the gate dielectric material 113 is provided with a moderately low thickness, such as 20-30 Å, a corresponding loss of material of the sacrificial layer 119 and the sidewall spacer structure 114 may be negligible.

Figure 1E:
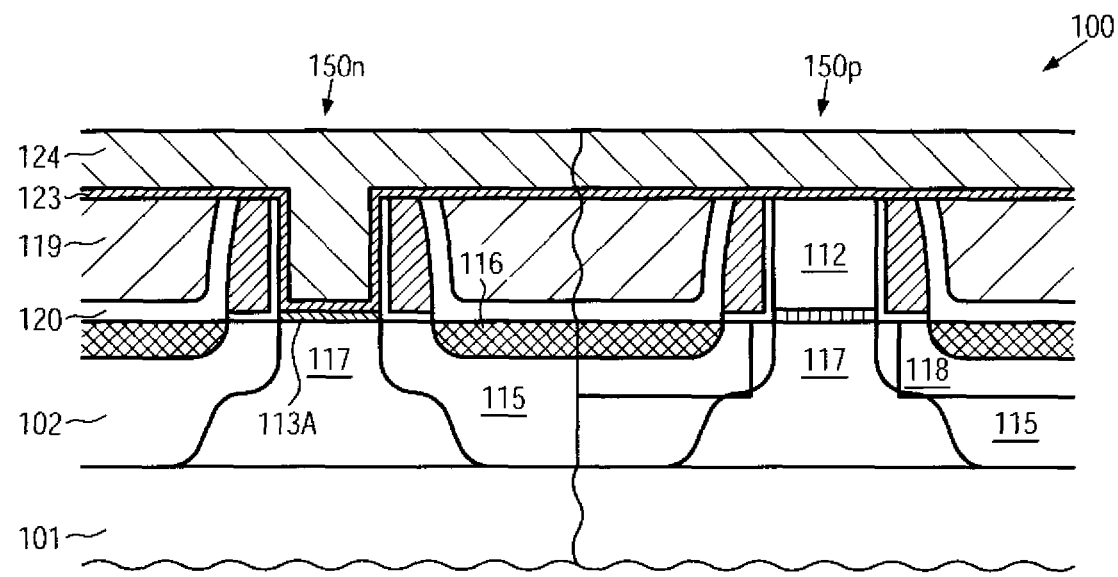

FIG. 1e schematically illustrates the semiconductor device 100 in a further advanced manufacturing stage, in which a high-k dielectric material and a metal-containing material may be provided to replace the conventional gate electrode structure 110. As shown, a layer 123 of a high-k dielectric material, which may represent one of the materials as mentioned above, may be formed with an appropriate thickness, which may range from approximately 15-25 Å in sophisticated applications, may be formed within the recess obtained by removing the conventional gate electrode structure 110. Furthermore, an appropriate metal-containing conductive material layer 124 may be formed to fill the previously formed recess, wherein, as previously explained, the metal-containing material 124 may have an appropriate work function as required for establishing a desired low threshold for the transistor 150n. For example, a tantalum nitride based material may be used for the layer 124, when the transistor 150n represents an N-channel transistor. Moreover, in one illustrative embodiment, a thin dielectric material 113A may be formed between the high-k dielectric material 123 and the channel region 117 so as to substantially avoid a direct contact of the high-k dielectric material 123 with the semiconductor material of the channel region 117, since many high-k dielectric materials may result in a mobility degradation when being in direct contact with a silicon-based material. The dielectric material 113A may, for instance, be provided in the form of an oxide, which, however, may be provided with a significantly reduced thickness compared to the conventional dielectric material 113. For instance, the thickness of the dielectric material may range from approximately 4-6 Å.

The semiconductor device 100 as shown in FIG. 1e may be formed on the basis of the following processes. After the removal of the conventional gate dielectric material 113, the dielectric material 113A may be formed, if required, on the basis of any appropriate technique, such as a wet chemical oxidation process performed on the basis of well-established chemistries, such as cleaning chemistries, which may provide a substantially self-limiting oxidation process with respect to a silicon material. In other illustrative embodiments, the previous removal of the conventional dielectric material 113 may be performed on the basis of a highly controllable etch process so as to not completely remove the material 113 in order to provide the layer 113A. Thereafter, the high-k dielectric material 123 may be deposited above the dielectric material 113A, for instance, on the basis of sophisticated atomic layer deposition (ALD) techniques, in which, for instance, a self-limiting process may be performed to provide layer after layer, each sub-layer having a well-defined thickness, thereby obtaining the finally desired overall thickness of the layer 123. Next, the metal-containing material may be deposited, for instance, by physical vapor deposition (PVD), chemical vapor deposition (CVD), electrochemical deposition techniques and the like, depending on the type of metal used. For instance, for tantalum nitride based materials, well-established PVD recipes may be used.

Thereafter, the excess material of the layers 124 and 123 may be removed, for instance, on the basis of a CMP process, in which the material of the sacrificial layer 119 may act as a stop layer. In order to provide enhanced surface planarity and reliably remove any material residues of the layers 124, a further CMP step may be performed with reduced or no selectivity with respect to the sacrificial layer 119, thereby removing any metal residues with high reliability.

Figure 1F:
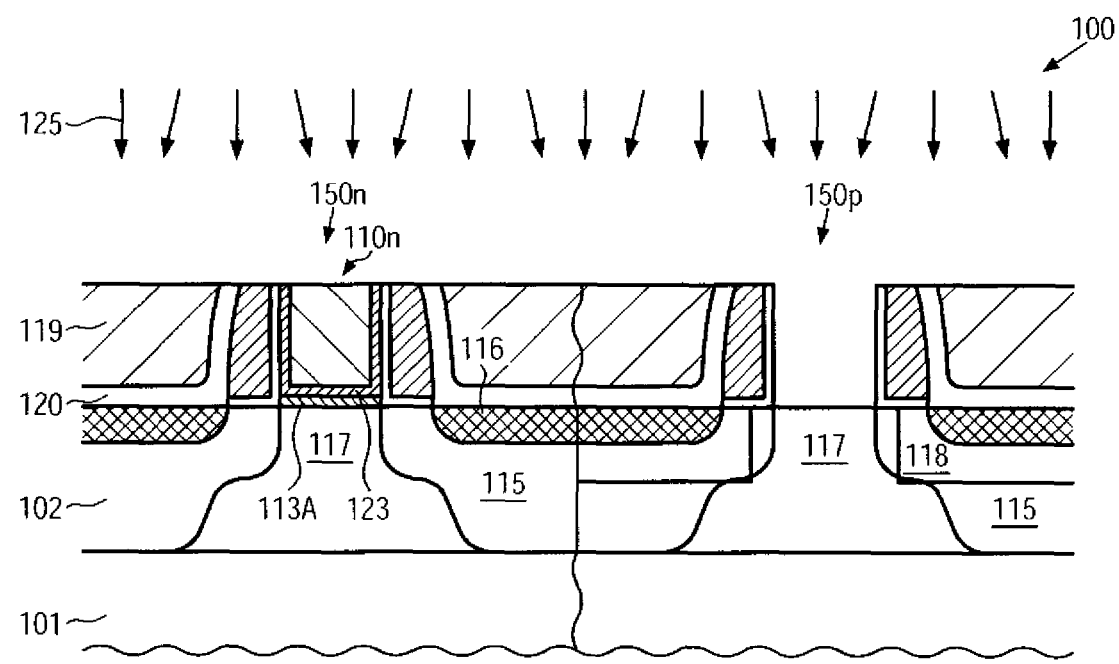

FIG. 1f schematically illustrates the semiconductor device 100 after completion of the above-described process sequence, wherein the device 100 is subjected to a selective etch process 125 to remove the gate electrode material 112 of the transistor 150p selectively with respect to a replacement gate electrode structure 110n of the transistor 150n. Thus, the etch process 125 represents a self-aligned etch process without requiring coverage of the transistor 150n, thereby reducing process complexity, since the process 125 may be performed without a lithography mask or, as will be described later on with reference to FIGS. 3a-3q, existing masking regimes may be used when the attack of the etch process 125 may also have to be blocked in other device areas, in which the conventional gate electrode structures are to be maintained.

In one illustrative embodiment, the selective etch process 125 is performed as a wet chemical etch process using a solution of TMHA, as previously explained, which may not substantially remove the high-k dielectric material and the metal of the replacement gate structure 110n. Thus, the gate dielectric material 112 may be removed and thereafter the gate dielectric material 113 may be removed or may be reduced in thickness, as previously described with reference to the transistor 150n. Prior to or after the corresponding process for removing or reducing the gate dielectric material 113, a resist mask, which may be provided in other device areas, may be removed on the basis of well-established plasma etch processes using an oxygen plasma.

Thereafter, an oxide-based dielectric material may be re-grown, if required, for instance, on the basis of an ozone-containing water, which may not substantially attack the metal-containing material of the replacement gate structure 110n. Next, a process sequence may be performed for depositing the high-k dielectric material followed by the deposition of an appropriate metal-containing material having the suitable work function for the transistor 150p. Thereafter, any excess material may be removed, for instance, on the basis of CMP, as previously described with reference to the transistor 150n.

Figure 1G:
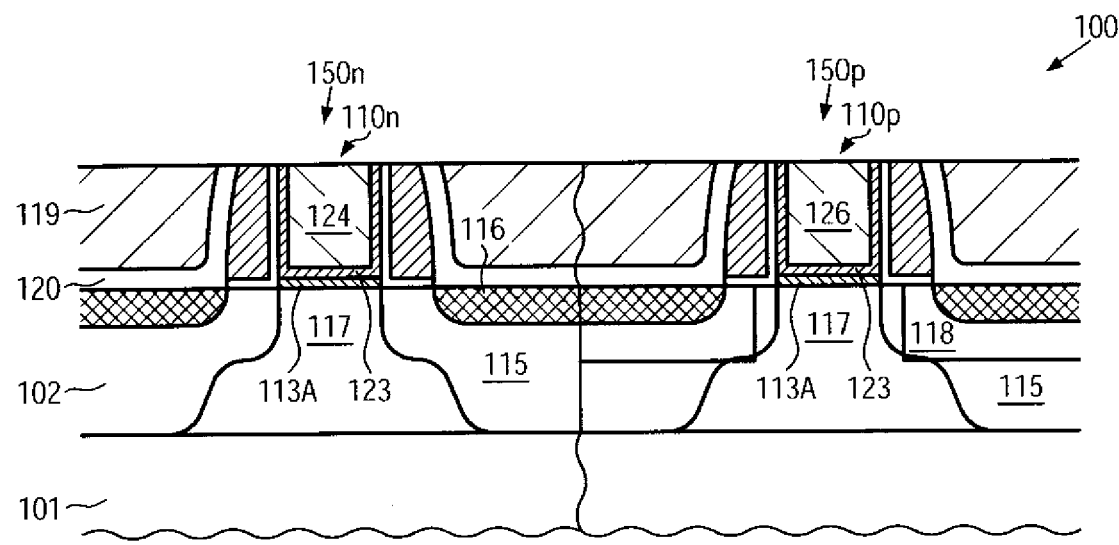

FIG. 1g schematically illustrates the semiconductor device 100 after the completion of the above-described process sequence. As shown, the transistor 150n comprises the replacement gate electrode structure 110n including the high-k dielectric material 123 and the metal-containing material 124 having the appropriate work function, wherein, if required, the gate dielectric material 113A may be provided. Similarly, the transistor 150p comprises a replacement gate structure 110p including a high-k dielectric material 123, which may be the same material or which may be a different material compared to the structure 110n, and metal-containing material 126, for instance, a titanium carbide based material, which has an appropriate work function for the transistor 150p. Also in this case, the gate dielectric 113A may be provided, if required. Thereafter, if required, the sacrificial material 119 may be removed and the further processing of the device 100 may be continued on the basis of well-established techniques, such as the provision of highly stressed dielectric materials above the transistors 150n, 150p.

Figure 1H:
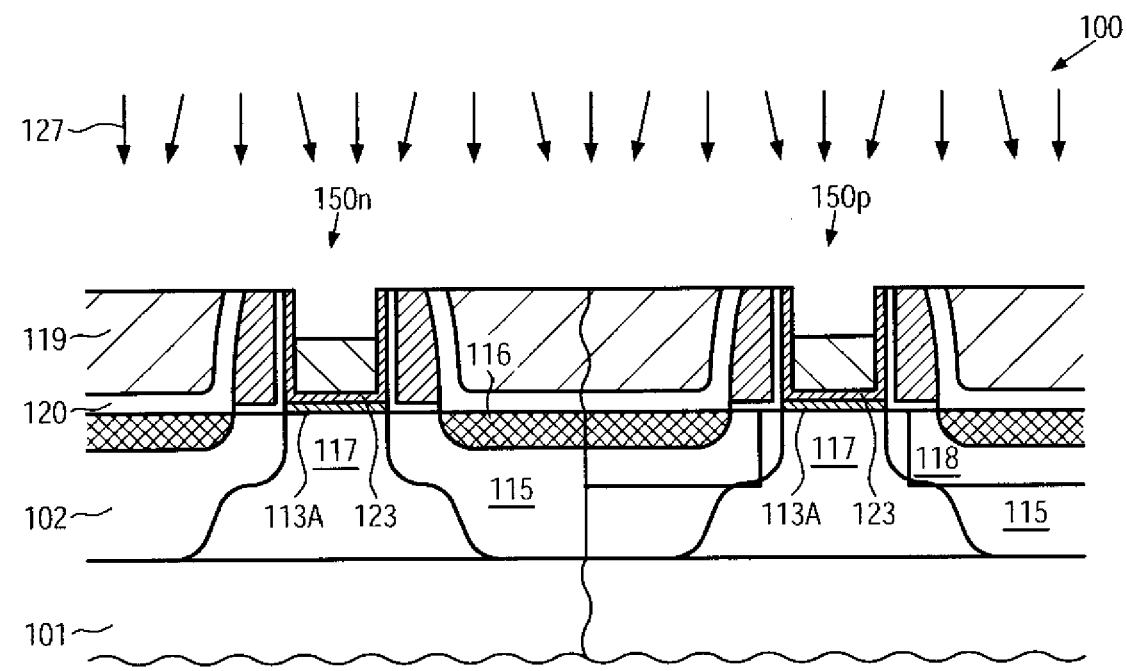

FIG. 1h schematically illustrates the semiconductor device 100 according to further illustrative embodiments, in which the replacement gate structures 110n, 110p are recessed on the basis of a selective etch process 127 so as to provide the possibility for depositing a further highly conductive material in both the transistors 150n, 150p for enhancing, for instance, further processing of the device 100, for instance with respect to selectively removing the sacrificial layer 119, since then an enhanced degree of flexibility for selecting an appropriate etch chemistry for selectively removing the sacrificial layer 119 with respect to the replacement gate structures 110n, 110p may be achieved. That is, after recessing the replacement gate structures 110n, 110p, wherein also the high-k dielectric material 123 may be etched, which may be advantageous in other device areas, such as shared gate electrode structures, as will be described later on with reference to FIGS. 3a-3q, a further metal-containing material or any other highly conductive material may be formed, thereby providing substantially similar etch and process conditions for the replacement gate electrode structures 110n, 110p. For example, an appropriate metal-containing material may be deposited and thereafter any excess material may be reliably removed, for instance, on the basis of CMP. Then, the further processing may be continued as described above.

With reference to FIGS. 2a-2d, further embodiments will now be described, in which a gate electrode structure formed in accordance with established process techniques may essentially be maintained, i.e., the gate dielectric material thereof and a portion of the gate electrode material may be maintained in certain device areas, while in other device areas the gate electrode structure of one or more transistor types may be replaced by a sophisticated high-k dielectric metal gate stack.

Figure 2A:
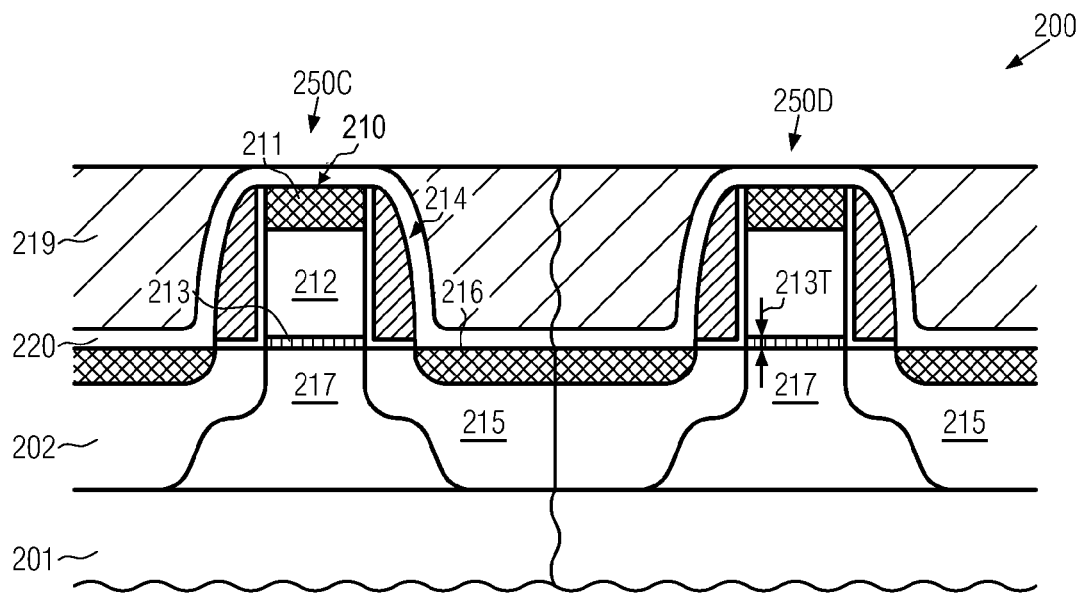
FIGS. 2a-2d schematically illustrate cross-sectional views of a semiconductor device for forming a highly sophisticated replacement gate electrode structure while maintaining the gate dielectric material and at least a portion of a conventional gate electrode structure designed for device regions requiring a gate dielectric material of increased thickness on the basis of an appropriate masking regime, according to still further illustrative embodiments.

FIG. 2a schematically illustrates a cross-sectional view of a semiconductor device 200 comprising a substrate 201 having formed thereon a semiconductor layer 202. Furthermore, a transistor 250C is formed in a first device region, in which a high performance at low threshold voltages of respective transistor elements may be required so that a gate electrode structure 210 may be replaced by a high-k dielectric metal gate structure in a later process stage. Similarly, a transistor 250D may represent one or more transistor types located in a device area, in which the respective gate electrode structure 210 is basically adapted so as to comply with the performance requirements of the transistor 250D. Consequently, the gate electrode structure 210 of the transistor 250D may comprise, in this manufacturing stage, a metal silicide region 211, a gate electrode material 212, for example provided in the form of polysilicon, and a gate dielectric material 213, a thickness 213T thereof may comply with the operational requirements for the transistor 250D. That is, the thickness 213T may be selected so as to enable the operation at appropriate supply voltages, which may be higher compared to the device areas of the transistor 250C, and/or the thickness 213T may be selected so as to obtain a desired reduced level of leakage current, as may be, for instance, required in certain memory areas and the like. It should be appreciated that the transistor 250D may represent a P-channel transistor or an N-channel transistor, both of which may be operated on the basis of the gate electrode structure 210 having the conventional gate dielectric material 213 with the appropriate thickness 213T. Furthermore, the transistors 250C, 250D may comprise drain and source regions 215 and respective metal silicide regions 216. Furthermore, a respective sidewall spacer structure 214 may be provided at sidewalls of the respective gate electrode structures 210. Moreover, a sacrificial layer 219 in combination with an etch stop layer 220 may be provided.

With respect to the components described so far, the same criteria may apply as previously explained with reference to the device 100, except for the configuration of the transistor 250D, which includes the dielectric 213 with appropriate characteristics for the operation of the transistor 250D. Thus, substantially the same process strategies may be applied as previously explained, wherein, however, any process sequences for forming a highly critical oxide-based gate insulation layer for the transistor 250C may be omitted. Furthermore, in this manufacturing stage, the surface topography of the device 200 may be planarized by removing any excess material of the sacrificial layer 219 by a CMP process, as previously explained, wherein the CMP process may be reliably stopped on the basis of the etch stop layer 220, as previously discussed.

Figure 2B:
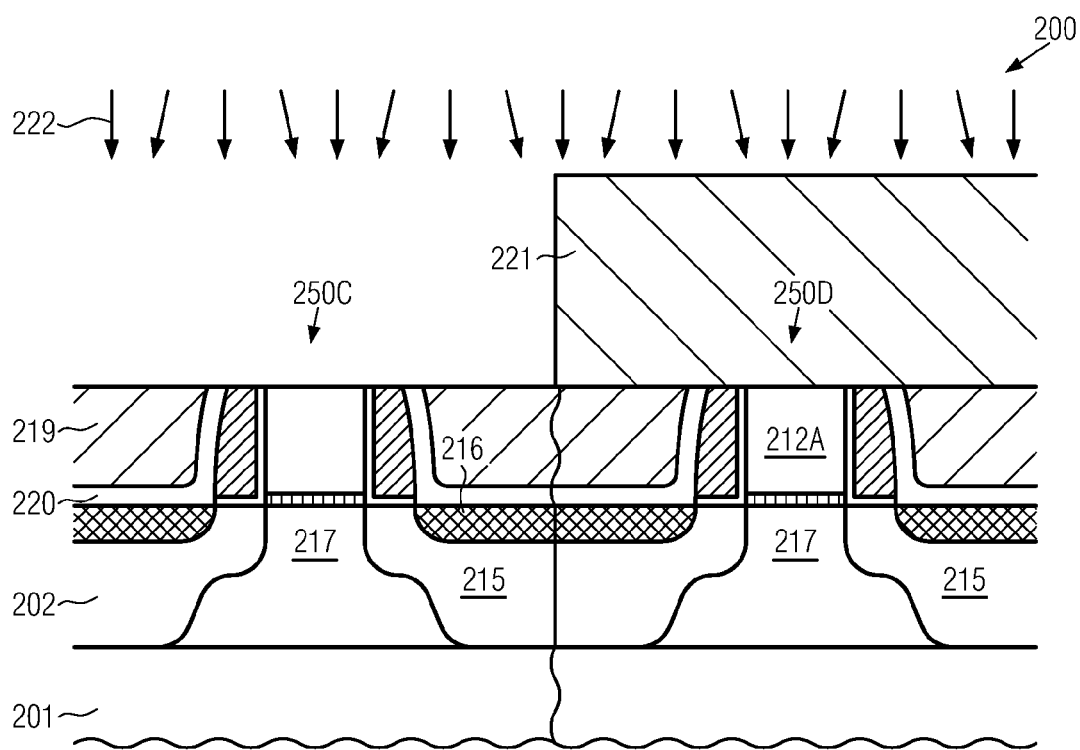

FIG. 2b schematically illustrates the semiconductor device 200 in a further advanced manufacturing stage, in which the dielectric materials 212 of the gate electrode structures 210 are exposed and wherein an etch mask 221, for instance provided in the form of a resist mask, covers the transistor 250D so as to protect a remaining portion 212A of the gate electrode material and the gate insulation layer 213 during an etch process 222 for removing the gate electrode material 212 in the transistor 250C. It should be appreciated that the etch mask 221 may also cover over device areas in which the respective gate electrode materials are to be maintained, at least temporarily, as will be described later on in more detail. The removal of the metal silicide regions 211 in combination with a portion of the sacrificial material 219 and the etch stop layer 220 may be accomplished on the basis of a non-selective CMP process as previously discussed. Thereafter, an appropriate lithography mask may be used for covering desired device areas, such as the transistor 250D. The etch process 222 may be performed on the basis of any selective etch chemistry for removing the gate electrode material 212 selectively to the sacrificial material 219 and the spacer structure 214. It should be appreciated that, in other cases, the sidewall spacer structure 214 may not be provided in this manufacturing stage or may be provided in the form of a moderately thin etch stop material, such as silicon nitride, which may be advantageous for the further processing in view of providing a stressed dielectric material for enhancing performance of the transistor 250C. For example, the etch process 222 may be performed on the basis of well-established plasma assisted etch chemistries for etching silicon in the presence of nitrogen and oxygen, when the gate electrode material 212 is substantially comprised of polysilicon. For other materials, other appropriate etch chemistries may be used. Furthermore, wet chemical etch processes, for instance based on TMAH, as previously explained, may also be used in order to appropriately remove the gate electrode material 212. After removing the gate electrode material 212, the etch mask 221 may be removed, for instance, on the basis of sulfuric acid and hydrogen peroxide or any other appropriate removal process, such as a plasma-based process, and the like. Next, the gate dielectric material 213 having the thickness 213T may be removed or may at least be reduced in thickness by an appropriate etch process, for instance on the basis of hydrofluoric acid, as previously explained with reference to the device 100. Thereafter, the further processing may be continued as previously explained, i.e., a high-k dielectric material may be deposited, for instance, after growing an appropriate conventional dielectric material, such as silicon dioxide, if a direct contact of the high-k dielectric material with the channel region 217 may not be desired. Subsequently, an appropriate metal-containing material may be deposited, which has an appropriate work function for the transistor 250C.

Figure 2C:
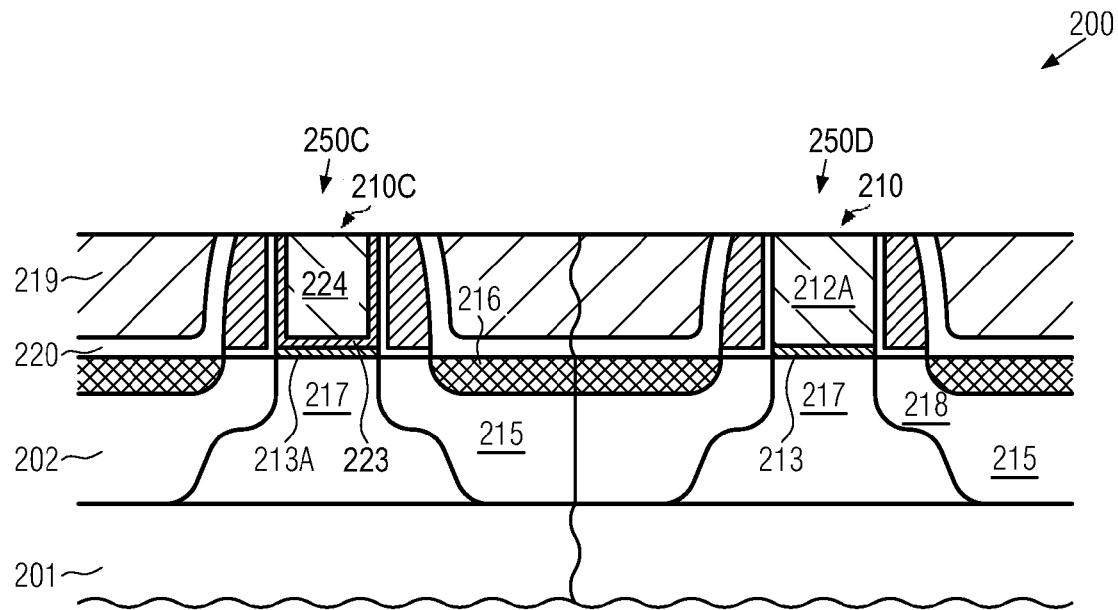

FIG. 2c schematically illustrates the device 200 after the above-described process sequence and after any removal process required for removing any excess material, thereby also providing a planarized surface topography. Thus, the transistor 250C comprises a replacement gate electrode structure 210C including a high-k dielectric material 223, possibly in combination with a re-grown or reduced conventional gate dielectric material 213A with a thickness of approximately 4-8 Å, and a metal-containing material 224 that is adapted to provide the required low threshold voltage for the transistor 250C. On the other hand, the transistor 250D comprises the gate electrode structure 210, however, without the metal silicide region 211, including the portion 212A and the initial gate dielectric layer 213.

Figure 2D:
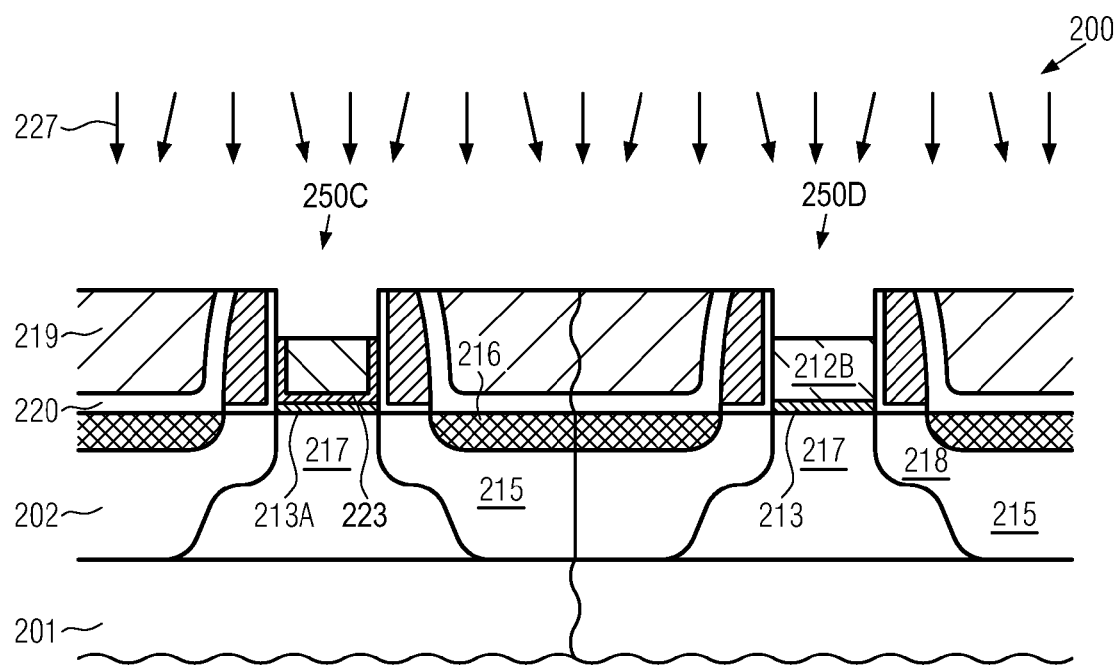

FIG. 2d schematically illustrates the semiconductor device 200 during a selective etch process 227 for recessing the gate electrode structure 210 and the replacement gate electrode structure 210C so as to form a highly conductive material on top of the gate electrode structure 210, thereby providing a replacement for the initial metal silicide region 211 in the gate electrode structure 210. The type of metal and the height of this metal may be selected so as to obtain a desired high conductivity of the gate electrode structure 210 without being restricted to any process margins demanded by the metal silicide process for forming the metal silicide regions 216 in the drain and source regions 215. The etch process 227 may, in one illustrative embodiment, be performed without any lithography masks and may therefore remove the metal of the metal gate structure 210C, possibly in combination with the high-k dielectric material 223, which may be advantageous with respect to other device areas, such as shared gate electrode lines, as will be described later on with reference to FIGS. 3a-3q. For example, chlorine-based etch chemistries may be used, for instance similar to conventional polysilicon etch processes, in which polysilicon may be selectively removed with respect to silicon dioxide and silicon nitride. Consequently, after forming respective recesses with a desired depth, an appropriate conductive material, such as tantalum, tungsten, copper in combination with barrier materials and the like, may be filled in the recesses so as to obtain a highly conductive gate electrode structure 210, which still comprises a portion 212B of the initial gate electrode material 212 and also has the initially formed gate dielectric layer 213. Thereafter, the further processing may be continued by removing any excess metal, for instance by CMP, and depositing a dielectric material prior to forming subsequent metallization layers. In other cases, the sacrificial material 219 may be removed to enable the deposition of a highly stressed material, for instance, for enhancing the performance of the transistor 250C.

Thus, also in the embodiments illustrated with reference to FIGS. 2a-2d, an efficient process sequence may be established with a high degree of compatibility with conventional strategies, wherein a high-k metal gate may be formed after the completion of any high temperature process, while, in some device areas, a portion of the initially fabricated gate structure may be maintained throughout the entire process.

Figure 3A:
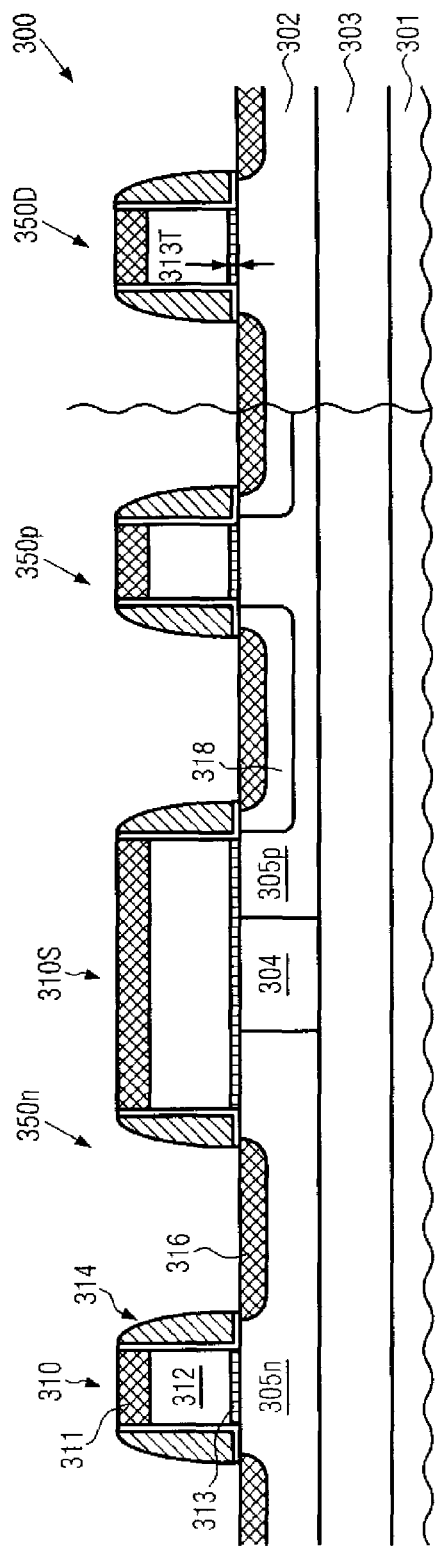
FIGS. 3a-3q schematically illustrate cross-sectional views of a semiconductor device during various manufacturing stages in forming sophisticated replacement gate electrode structures with a high degree of compatibility with conventional techniques while substantially maintaining a conventional gate electrode structure in certain device areas, wherein additional strain-inducing mechanisms may be included into the integration scheme, according to still further illustrative embodiments.
Figure 3B:
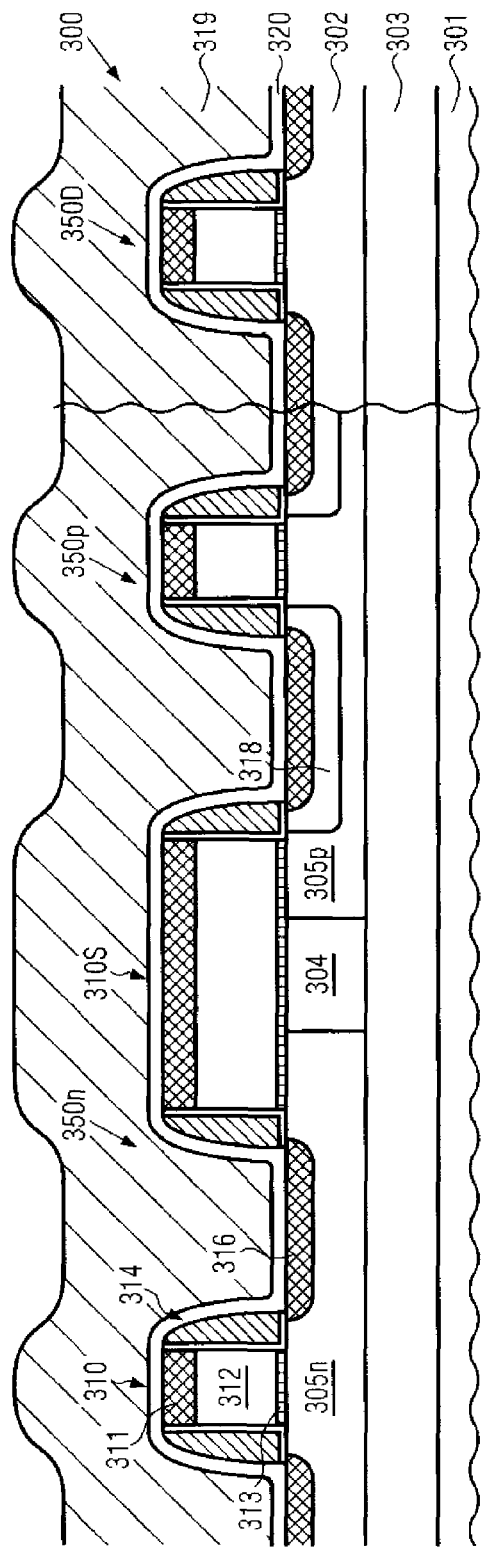
Figure 3O:
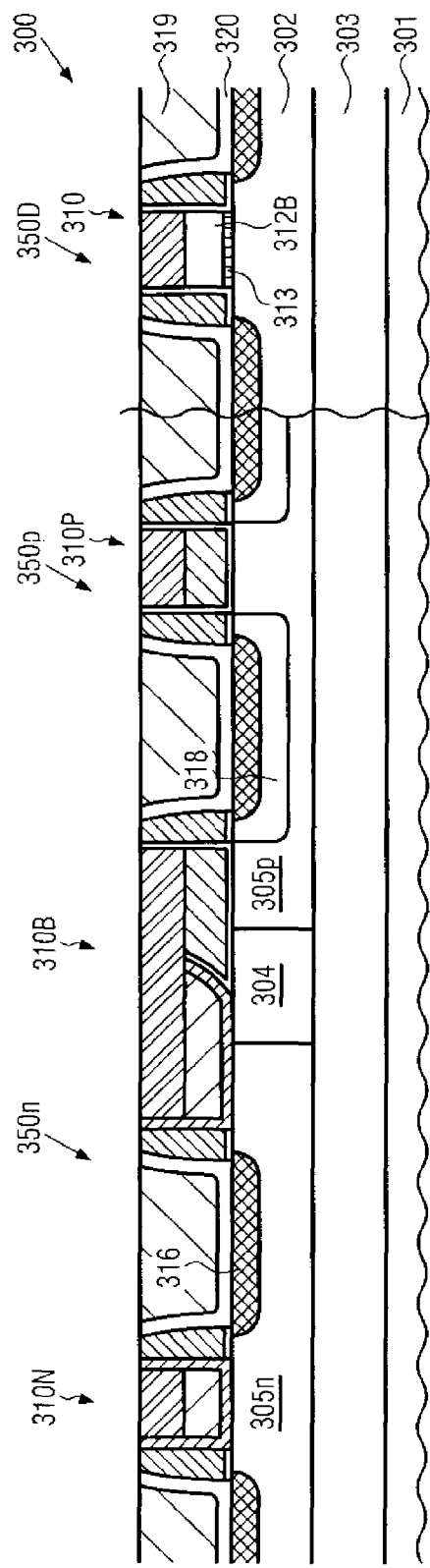
Figure 3P:
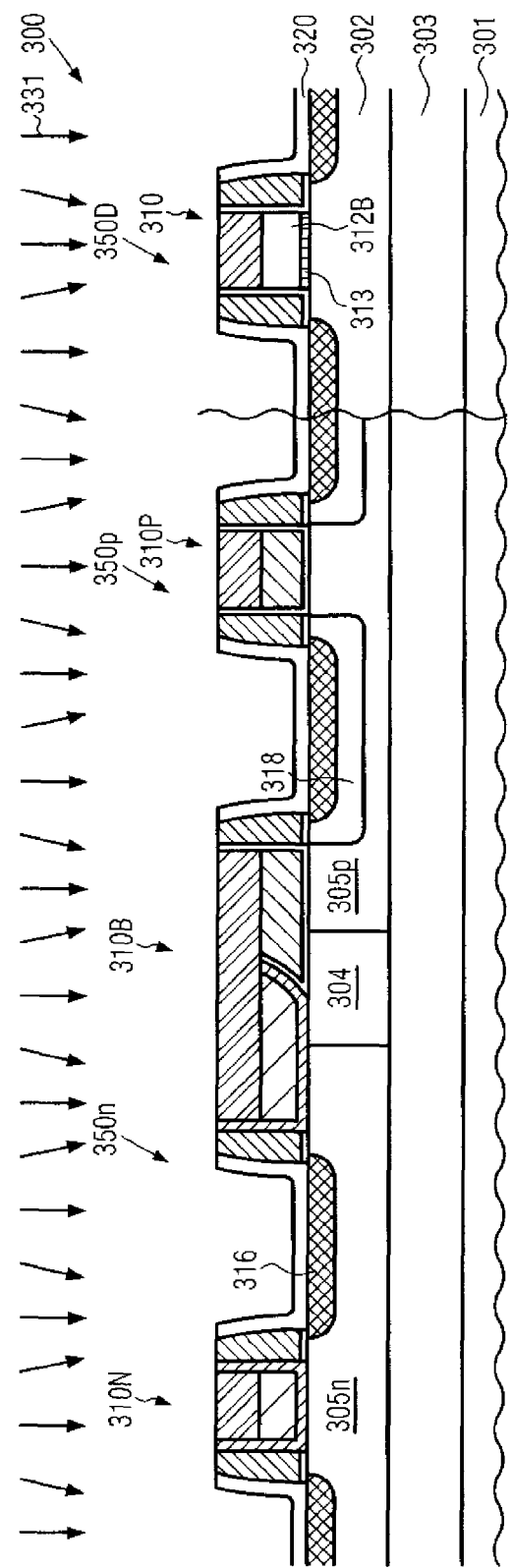
Figure 3Q:
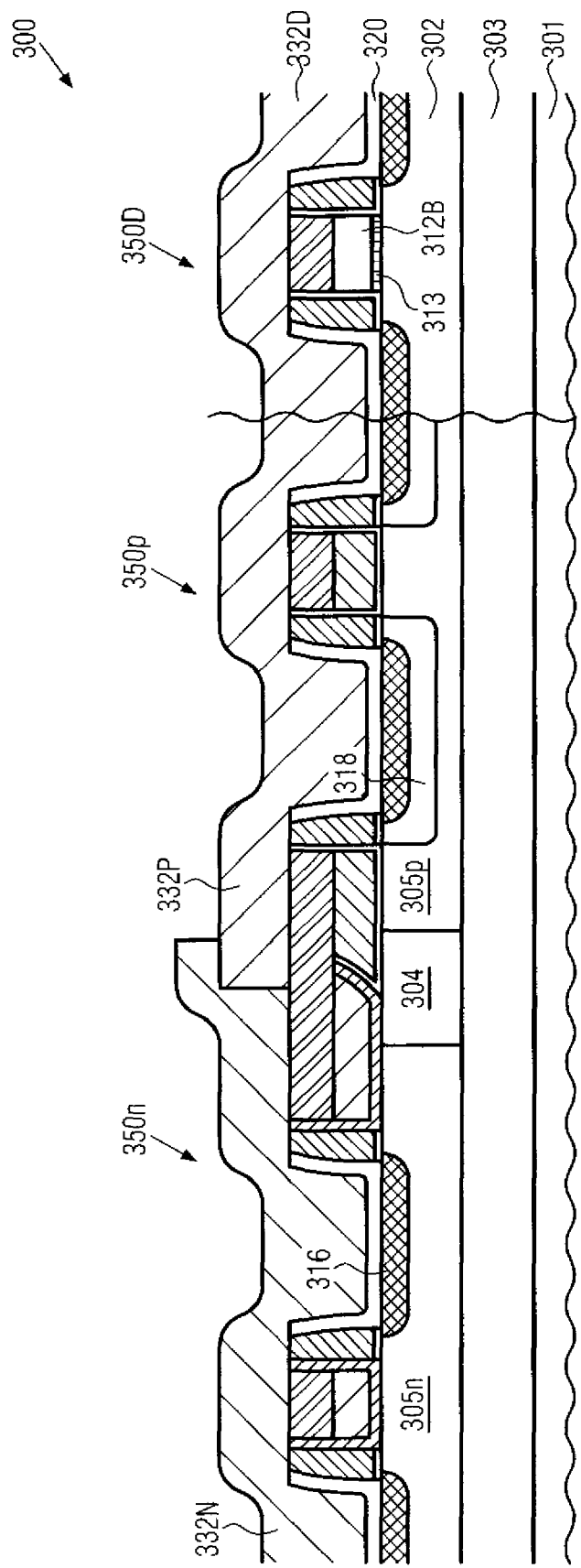

With reference to FIGS. 3a-3q, further illustrative embodiments will be described in more detail, in which process steps of the embodiments described with reference to FIGS. 1a-1d and 2a-2c may be used and may be combined so as to obtain appropriate replacement gate structures for high performance transistors operating at low threshold voltages, while concurrently maintaining at least a portion of initially formed gate electrode structures in certain device areas.

FIG. 3a schematically illustrates a semiconductor device 300 in a manufacturing stage in which respective transistor elements 350n, 350p and 350D are substantially completed, i.e., these transistor elements have experienced any high temperature treatments and the like. Thus, in the manufacturing stage as shown, the device 300 may comprise a substrate 301 and a semiconductor layer 302, wherein, in some embodiments, a buried insulating layer 303 may be provided so as to represent an SOI configuration. As previously explained, the buried insulating layer 303 may be omitted or may be provided only in certain device areas, depending on the device requirements. Furthermore, an isolation structure 304, for instance a trench isolation structure, which may be substantially comprised of any appropriate insulating material, such as silicon dioxide, silicon nitride and the like, may be provided to separate an active region 305n, having an appropriate base dopant concentration for forming the transistor 350n, from an active region 305p, having an appropriate dopant concentration for forming the transistors 350p. For instance, the transistors 350n may represent N-channel transistors while the transistors 350p may represent P-channel transistors. Moreover, in the embodiment shown, the transistors 350n, 350p may comprise respective components or transistors including a shared gate electrode structure 310S, which extends from above the active region 305n to above the active region 305p. For example, the shared gate electrode structure 310S may represent a common gate electrode structure for an N-channel transistor and a P-channel transistor, respectively, wherein the gate electrode structure 310S is shown to extend along the respective transistor width direction. Furthermore, the device 300 may comprise a transistor 350D, which may represent any transistor type, which may require different gate dielectric characteristics compared to the transistors 350n, 350p, for instance, the transistor 350D may be operated at a higher operating voltage, thereby requiring an increased thickness of the respective gate dielectric material and the like. For example, for the transistor 350D, the same criteria may apply as previously explained with reference to the transistor 250D.

Consequently, in this manufacturing stage, each of the transistors 350n, 350p, 350D may comprise a metal silicide region 311, a conventional gate electrode material 312 and a gate dielectric material 313, such as a silicon dioxide based material, wherein, in one illustrative embodiment, a thickness 313T may be appropriate for the operation of the transistor 350D, as also previously explained with reference to the transistor 250D.

Moreover, in some cases, a spacer structure 314 may be provided at sidewalls of the gate electrode structures 310 and 310S, while, in other cases, the spacer structure 314 may have been removed after the formation of metal silicide regions 316 formed in the respective drain and source regions (not shown). Furthermore, as previously described with reference to the device 100, one or more of the transistors 350n, 350p may have incorporated therein additional strain-inducing mechanisms, such as a semiconductor alloy 318, for enhancing the strain in a respective channel region of the transistor 350p. However, a corresponding mechanism may also be provided for the transistor 350n on the basis of appropriate semiconductor materials.

It should be appreciated that, with respect to the components described so far, the same criteria apply as previously explained with reference to the devices 100 and 200. Hence, the device 300 may be formed on the basis of process techniques as previously described with reference to the devices 100 and 200, wherein, in one illustrative embodiment, the thickness 313T of the gate dielectric material 313 may be selected such that it corresponds to a design thickness, i.e., a target thickness, for the transistor 350D, since the dielectric material 313 of this transistor and a portion of the respective gate electrode material 312 may be maintained, while replacing the gate electrode structures 310, 310S of the transistors 350n, 350p.

FIG. 3b schematically illustrates the semiconductor device 300 in a further advanced manufacturing stage, in which a sacrificial layer 319 in combination with an etch stop layer 320 may be formed. With respect to the sacrificial layer 319, the same criteria apply as previously explained. Similarly, the etch stop layer 320 may be provided in the form of, for instance, a silicon nitride material which may have high compressive stress with a thickness of approximately 5-15 nm.

FIG. 3c schematically illustrates the semiconductor device 300 after removing excess material of the sacrificial layer 319, for instance, on the basis of a selective CMP process, as previously explained, wherein the etch stop layer 320 may also act as a CMP stop layer. Thereafter, a further substantially non-selective CMP process may be performed to expose the gate electrode materials 312 in the gate electrode structures 310, 310S.

FIG. 3d schematically illustrates the semiconductor device 300 after the substantially non-selective CMP process. Since the non-selective CMP process may grind away the respective materials, i.e., the etch stop layer 320, the sacrificial layer 319, the sidewall spacer structure 314, if provided, and the metal silicide regions 311, a substantially planar surface topography may be obtained.

FIG. 3e schematically illustrates the semiconductor device 300 with an etch mask 321 formed above the device areas corresponding to the transistors 350p and 350D in order to protect these transistors during a selective etch process 322 that is designed to selectively remove the gate electrode material 312 of exposed transistor devices, such as the transistors 350n. With respect to the characteristics of the etch process 322, substantially the same criteria apply as previously explained with reference to the etch process 122. That is, the process 322 may be based on a selective etch chemistry in a plasma-based etch ambient, wherein a certain degree of isotropy may be used to reliably remove the gate electrode material 312 in the exposed gate electrode structure 310 and in the exposed portion of the shared gate electrode structure 310S, while also providing a certain process margin for under-etching the etch mask 321 in the shared gate electrode structure 310S. In other cases, highly selective wet chemical etch chemistries may be used, for instance on the basis of TMAH, as previously explained.

FIG. 3f schematically illustrates the semiconductor device 300 after the removal of the etch mask 321, for instance, on the basis of a wet chemical recipe using sulfuric acid and hydrogen peroxide, or on the basis of a plasma-assisted ash process. Furthermore, in some illustrative embodiments, the dielectric gate material 313 may be removed in exposed portions by an appropriate etch process, for instance, by using hydrofluoric acid, when silicon dioxide based materials are used in the gate dielectric layers 313. Thereafter, in some illustrative embodiments, when a direct contact of a high-k dielectric material with the underlying semiconductor materials of the active region 305n is not desired, a corresponding appropriate dielectric material 313A may be formed, for instance, by oxidation, deposition and the like. For instance, an oxide may be formed on the basis of a wet chemical oxidation process using chemicals, such as APM, HPM, which may result in highly controllable native oxide, if a silicon-based material is used for the active region 305n. In other cases, any appropriate deposition or surface treatment may be used in order to obtain a dielectric layer with a thickness of approximately 4-6 Å.

FIG. 3g schematically illustrates the semiconductor device 300 with a high-k dielectric material 323 and an appropriate gate metal material 324 with a suitable work function for appropriately adjusting the threshold voltage of the transistors 350n with respect to a low threshold voltage. The layers 323 and 324 may be formed on the basis of respective process techniques previously described with reference to the devices 100 and 200. For example, the transistors 350n may represent N-channel transistors, wherein the material of the layer 324 may be provided in the form of a tantalum nitride based material. It should further be appreciated that, if the transistors 350n represent P-channel transistors, a respective metal layer 324 may be provided, for instance, in the form of a tantalum carbide material and the like.

FIG. 3h schematically illustrates the semiconductor device 300 after the removal of any excess material of the layers 324 and 323, which may be accomplished on the basis of a removal process including a CMP process that may be performed as a selective process using the sacrificial material 319, which may be provided in the form of an oxide material, and the like. Thereafter, an additional CMP step may be added in which a substantially non-selective behavior may be used to reliably remove any material residues above the transistors 350n, 350p and 350D. Thus, the transistors 350n comprise respective replacement gate electrode structures 310N corresponding to the gate electrode structures 310, and a replacement gate electrode structure 310B that corresponds to the shared gate electrode structure 310S. That is, in the gate electrode structure 310B, a portion formed above the active region 305n comprises the metal-containing material 324 and the high-k dielectric material 323, while the remaining portion located above the active region 305p still includes the conventional dielectric 313 and the conventional gate electrode material 312.

FIG. 3i schematically illustrates the semiconductor device 300 having formed thereon a further etch mask 328, for instance, in the form of a resist mask, which may cover, in one illustrative embodiment, the transistor 350D, while exposing the transistors 350n, 350p. In other illustrative embodiments, the etch mask 328 may also cover the transistor 350n, if a desired high etch selectivity of the metal-containing material 324 and the high-k dielectric material 323 with respect to an etch ambient 325 may not be sufficient. In this case, i.e., also covering the transistor 350n, a similar etch technique as described with reference to the process 322 may be used to selectively remove the gate electrode material 312 from exposed portions of the gate electrode structures 310B and 310. In the embodiment illustrated in FIG. 3i, the etch process 325 may be designed as a highly selective isotropic etch process on the basis of a wet chemical solution which has a high degree of selectivity with respect to the material of the mask 328, the sacrificial layer 319 and the sidewall spacer structures 314, if provided, and the metal-containing material 324 and the high-k dielectric material 323. For example, a solution including TMAH, as previously explained with reference to the etch process 125, may be used to obtain the desired selectivity during the process 325. Thereafter, the etch mask 328 may be removed, for instance, on the basis of a plasma-assisted ash process, and the exposed gate dielectric layers 313 may be removed or at least significantly reduced in thickness by any appropriate process, such as a wet chemical etch process on the basis of hydrofluoric acid, if silicon dioxide based materials are considered.

FIG. 3j schematically illustrates the semiconductor device 300 after the above-described process sequence. Any material removal of the replacement gate structures 310N and 310B during the removal of the gate dielectric material 313 may be less critical, since a portion of these materials may be removed in a later manufacturing step and may be replaced by a further metal-containing material, as will be described later on. It should be appreciated that, depending on the etch chemistry for removing the dielectric material 313, the high-k dielectric layer 323 may remain in a more or less continuous state in the replacement gate electrode structure. Thereafter, an appropriate dielectric material may be deposited or otherwise formed, for instance by oxidation, if a direct contact of a further high-k dielectric material with the active region 305p may be considered inappropriate with respect to, for instance, degradation of charge carrier mobility. To this end, an oxide may be grown, as is for instance described with reference to the device 200.

FIG. 3k schematically illustrates the semiconductor device 300 in a further advanced manufacturing stage, in which a further high-k dielectric material 329 may be deposited, possibly in combination with a previously formed dielectric material 313A, as previously explained, wherein, in some illustrative embodiments, the high-k dielectric material 329 may be substantially the same material as the material 323, while, in other illustrative embodiments, a different type of material may be used. Furthermore, a further metal-containing material 326 may be formed above the device 300, wherein the material 326 has an appropriate work function designed to appropriately adjust the threshold voltage of the transistors 350p. For example, if the transistors 350p represent P-channel transistors, a tantalum carbide based material may be used. With respect to any process techniques for forming the high-k dielectric layer 329 and the metal layer 326, the same criteria apply as previously explained with reference to the device 100.

FIG. 3l schematically illustrates the semiconductor device 300 after removal of the excess material, which may be accomplished on the basis of CMP techniques, as discussed above. Hence, a replacement gate structure 310P is formed in the transistor 350p, wherein the shared gate electrode structure 310B comprises the portion 324 and a portion of the material 326, wherein, however, the layers 323 and/or 329, if different materials are used, may result in an electrical insulation of the portions 324 and 326.

FIG. 3m schematically illustrates the semiconductor device 300 during a further selective etch process 327, in which the replacement gate electrode structures 310N, 310P and 310B may be recessed, thereby also removing the isolation caused by the material layers 323 or 329 in the shared gate electrode structure 310B. In one illustrative embodiment, the process 327 may also remove material of the gate electrode structure 310 of the transistor 350D, thereby providing the potential for refilling the gate electrode structure 310 by a highly conductive metal-containing material. For this purpose, the etch process 327 may be performed on the basis of a chlorine-based chemistry, as previously explained with reference to the etch process 227 when describing the manufacturing sequence for the device 200.

FIG. 3n schematically illustrates the semiconductor device 300 after the deposition of a further metal-containing material 330, which may be provided in the form of any appropriate highly conductive material, in order to obtain a high conductivity and a high degree of compatibility with the further processing of the device 300. For example, titanium nitride or a titanium nitride barrier layer in combination with a copper material, or any other appropriate materials, may be used to provide a conductive connection within the shared gate electrode structure 310B and also provide a highly conductive metal-containing strap in the gate electrode structure 310 of the transistor 350D. Furthermore, the material 330 may have a desired high etch resistivity with respect to an etch process for removing the sacrificial material 319, if a replacement of this material by a highly stressed dielectric material is desired. For forming the material 330, any appropriate deposition technique may be used, such as PVD, CVD, electrochemical deposition or any combination of these techniques. Next, any excess material of the layer 330 may be removed on the basis of CMP techniques, as previously described. That is, a selective CMP step may be used which may be controlled on the basis of the sacrificial layer 319 followed by a non-selective CMP step for reliably removing any metal residues.

FIG. 3o schematically illustrates the device 300 after the completion of the above-described process sequence. Hence, the device 300 comprises the respective replacement gate electrode structures 310N, 310B and 310P, wherein the shared gate electrode structure 310B now comprises a highly conductive connection from above the active region 305n to above the active region 305p, due to the metal 330, while the transistor 350D comprises a gate electrode structure 310 still containing a portion 312B of the initial gate electrode material 312 and the initial gate dielectric layer 313, while the material 330 provides a highly conductive gate electrode, thereby substituting the initial metal silicide region 311 that has been removed during the preceding process sequence.

FIG. 3p schematically illustrates the semiconductor device 300 according to further illustrative embodiments during a selective etch process 331 to remove the sacrificial layer 319, wherein the metal 330 may provide the desired etch selectivity during the process 331. For example, in one illustrative embodiment, the process may comprise a wet chemical etch process on the basis of hydrofluoric acid, if the sacrificial material 319 is provided in the form of a silicon dioxide based material, thereby providing a high degree of etch control since the process 331 may reliably stop on the etch stop layer 320. Depending on the further device requirements, the etch stop layer 320 may also be removed, at least from certain device portions, if a respective intrinsic stress may be considered inappropriate for the further processing of this device. For example, in some illustrative embodiments (not shown), the etch stop layer 320 may be removed while also removing a portion of the sidewall spacer structure 314, if provided in this manufacturing stage, thereby enabling the deposition of a highly stressed material closer to the respective channel regions of the transistors 350n, 350p. In other cases, the sidewall spacer structure 314, if still present in this manufacturing stage, may be maintained and the further process sequence may be performed to selectively form a compressively stressed dielectric material above the transistors 350p, if representing P-channel transistors, while forming a tensilely stressed dielectric material above the transistors 350n, if representing N-channel transistors. Similarly, a respective stressed dielectric material may be formed above transistor 350D, if appropriate, depending on the type of transistor, or in other cases a substantially relaxed material may be provided above the transistor 350D, if any external stress-inducing mechanism is considered inappropriate for the specific device area.

FIG. 3q schematically illustrates the semiconductor device 300 after the completion of the above-described process sequence. That is, the transistors 350n may have formed thereabove an appropriately stressed dielectric layer 332N, which may have a high intrinsic compressive or tensile strain, depending on the type of transistor. Similarly, the transistor 350p may have formed thereabove a respective highly stressed material 332P with an appropriate intrinsic stress so as to enhance the performance of these transistors, while the transistor 350D has formed thereabove a dielectric material 332D which has an appropriate magnitude and type of intrinsic stress, which may even be a substantially neutral stress level, depending on the characteristics of the transistor 350D. It should be appreciated that, for the device 300 as shown in FIG. 3q, any appropriate process sequence for forming an appropriately stressed dielectric material above the respective transistor elements may be used, wherein, in some cases, the initially deposited etch stop layer 320 may remain over certain device areas, if the corresponding intrinsic stress is considered appropriate. It should further be appreciated that the transistors 350n, 350p may represent any high performance transistors operating on the basis of high drive currents at low threshold voltages in combination with high-k metal gate electrodes, while the transistor 350D may operate on the basis of the initially formed gate electrode structure 310. In this case, a plurality of different initial gate structures may have been formed, for instance, two different thicknesses for the gate dielectric layers 313 may have been provided so that the process sequence described above may readily be expanded to various types of transistors 350D requiring different initial oxide thicknesses by appropriately adapting the respective etch mask 328 (see FIG. 3i).

As a result, the subject matter disclosed herein provides a technique and corresponding semiconductor devices which enable high-k metal gate functionality, while maintaining other gate dielectrics used in respective device areas, for instance, for operating transistors at higher voltages and the like. Furthermore, the process sequence disclosed herein is highly compatible with conventional process strategies for forming the transistor structures, thereby also enabling the integration of any desired strain-inducing mechanisms, such as embedded semiconductor alloys, stress memorization techniques, i.e., techniques in which active regions may be substantially amorphized and may be re-grown in the presence of a rigid overlayer to establish a strained state of the re-grown semiconductor material, even after the removal of the rigid overlayer, and the like. Furthermore, the process techniques disclosed herein may also be advantageously combined with well-established process techniques for positioning an appropriately stressed dielectric material above respective transistor elements, such as dual stressed liner approaches and the like, substantially without requiring any modification of these sequences. In addition, in some illustrative embodiments, the replacing of conventional gate electrode structures by high-k dielectric metal gate structures may be accomplished on the basis of only a small number of additional masking steps, which may be accomplished by performing a highly selective etch process for recessing a gate electrode structure in the presence of a non-masked metal gate structure, thereby significantly reducing the degree of process complexity. Furthermore, in some illustrative embodiments, an overall reduced gate height may be accomplished, while nevertheless providing enhanced gate conductivity, wherein the reduced gate height may result in a lower gate-to-contact capacitance, thereby further enhancing performance of the transistors.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a first transistor above a first device region, said first transistor comprising a first gate electrode structure and first source/drain regions;
    forming a second transistor above a second device region, said second transistor comprising a second gate electrode structure and second source/drain regions;
    forming an etch stop layer at least above each of said first and second gate electrode structures and each of said first and second source/drain regions of said first and second transistors;
    forming a sacrificial layer above said etch stop layer;
    exposing gate electrode material of each of said first and second gate electrode structures after forming said etch stop and sacrificial layers;
    replacing said first gate electrode structure with a first replacement gate structure comprising a high-k dielectric material and a first metal-containing gate electrode material while covering said second transistor by a mask;
    removing said second gate electrode structure on the basis of a first selective etch process while said first replacement gate electrode structure is also exposed to said selective etch process;
    forming a second replacement gate electrode structure comprising a high-k material and a second metal-containing gate electrode material;
    after forming said second replacement gate electrode structure, performing a second selective etch process on the basis of said etch stop layer to remove said sacrificial layer from above at least one of said first and second transistors; and
    after removing said sacrificial layer, removing said etch stop layer from above said at least one of said first and second transistors.

2. The method of claim 1, wherein said first selective etch process is performed on the basis of an etch chemistry comprising tetramethyl ammonium hydroxide (TMAH).

3. The method of claim 1, further comprising selectively removing material of said first and second replacement gate electrode structures to form recesses therein and refilling said recesses with a third metal-containing material.

4. The method of claim 1, wherein said first metal-containing material has a first work function and said second metal-containing material has a second work function differing from said first work function.

5. The method of claim 1, further comprising forming a dielectric layer having an intrinsic stress above at least one of said first and second transistors after removing said sacrificial layer.

6. The method of claim 1, further comprising, while removing said etch stop layer, removing at least a portion of a sidewall spacer structure formed on sidewalls of at least one of said first and second transistors.

7. The method of claim 1, further comprising forming a third transistor having a third gate electrode structure above a third device region and maintaining at least a portion of gate electrode material of said third gate electrode structure when replacing said first gate electrode structure and removing said second gate electrode structure.

8. The method of claim 7, wherein forming said first, second and third transistors comprises forming a gate insulation layer for said first, second and third transistors so as to have characteristics required for forming said third transistor.

9. The method of claim 1, wherein exposing gate electrode material of each of said first and second gate electrode structures comprises removing excess material of said sacrificial layer by performing a first chemical-mechanical polishing process based on said etch stop layer.

10. The method of claim 9, further comprising performing a second chemical-mechanical polishing process to remove at least a portion of each of said sacrificial and etch stop layers, and an upper portion only of each of said first and second gate electrode structures.

11. The method of claim 1, wherein exposing gate electrode material of each of said first and second gate electrode structures comprises removing only an upper portion of each of said first and second gate electrode structures using said sacrificial layer prior to replacing said first gate electrode structure.

12. The method of claim 11, wherein replacing said first gate electrode structure comprises selectively etching gate electrode material of said first gate electrode structure after removal of said upper portion thereof to expose a dielectric gate insulation material, removing said dielectric gate insulation material, and forming a dielectric replacement gate insulation material comprising said high-k material.

13. The method of claim 12, wherein forming said dielectric replacement gate insulation material comprises forming a first dielectric material and forming said high-k dielectric material on said first dielectric material.

14. The method of claim 12, wherein gate electrode material of said first gate electrode structure is removed by a selective dry etch process.

15. The method of claim 12, wherein gate electrode material of said first gate electrode structure is removed by a selective wet etch process.

16. A method, comprising:
forming a first gate electrode structure in a first device region and a second gate electrode structure in a second device region, each of said first and second gate electrode structures comprising a gate insulation dielectric and a gate electrode material, said gate insulation dielectric having a first thickness according to a design thickness of said second gate electrode structure;
forming an etch stop layer and a sacrificial layer above each of said first and second gate electrode structures and above source/drain regions of each of said first and second gate electrode structures;
removing an upper portion of said first and second gate electrode structures to expose said gate electrode material based on said etch stop and sacrificial layers;
forming a mask to cover said second gate electrode structure;
selectively removing said gate electrode material and said gate insulation layer of said first gate electrode structure;
replacing said first gate electrode structure by a first replacement gate electrode structure comprising a first high-k dielectric material and a first conductive metal-containing material while maintaining said gate insulation dielectric and a portion of said gate electrode material of said second gate electrode structure; and
after replacing said first gate electrode structure, removing said sacrificial layer and said etch stop layer from above said source/drain regions of at least one of said first and second gate electrode structures.

17. The method of claim 16, further comprising forming a conductive material on said first replacement gate electrode structure and said second gate electrode structure in a common process sequence.

18. The method of claim 16, wherein replacing said first gate electrode structure further comprises forming a dielectric material after removal of said gate insulation layer and depositing said first high-k dielectric material on said dielectric material.

19. The method of claim 16, further comprising forming a third gate electrode structure of a third transistor above said first device region, and replacing said third gate electrode structure with a second replacement gate electrode structure including a second high-k material and a second conductive metal-containing gate electrode material.

20. The method of claim 19, further comprising forming a first stress-inducing layer above said first transistor and a second stress-inducing layer above said third transistor, said first and second stress-inducing layers having a different type of intrinsic stress.

21. The method of claim 19, wherein replacing said third gate electrode structure comprises removing said third gate electrode structure on the basis of a selective etch process without covering said first replacement gate electrode structure and said second gate electrode structure.

22. The method of claim 21, wherein said selective etch process is performed on the basis of TMAH.

* * * * *